United States Patent
Zhang et al.

(10) Patent No.: US 12,107,617 B2
(45) Date of Patent: *Oct. 1, 2024

(54) RF FILTER FOR USE AT 5G FREQUENCIES

(71) Applicant: Ticona LLC, Florence, KY (US)

(72) Inventors: Xiaowei Zhang, Union, KY (US);
Xinyu Zhao, Cincinnati, OH (US);
Christopher McGrady, Walton, KY (US)

(73) Assignee: Ticona LLC, Florence, KY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,280

(22) Filed: May 3, 2023

(65) Prior Publication Data

US 2023/0299811 A1 Sep. 21, 2023

Related U.S. Application Data

(63) Continuation of application No. 16/995,918, filed on Aug. 18, 2020, now Pat. No. 11,646,760.

(60) Provisional application No. 63/024,574, filed on May 14, 2020, provisional application No. 63/009,007, filed on Apr. 13, 2020, provisional application No. 62/904,109, filed on Sep. 23, 2019.

(51) Int. Cl.
*H04B 1/405* (2015.01)
*H04B 1/04* (2006.01)
*H04B 1/10* (2006.01)

(52) U.S. Cl.
CPC ............... *H04B 1/405* (2013.01); *H04B 1/04* (2013.01); *H04B 1/1018* (2013.01)

(58) Field of Classification Search
CPC ........ H04B 1/405; H04B 1/04; H04B 1/1018; H04B 1/18; H04B 1/0458
USPC ........................................................ 375/262
See application file for complete search history.

(56) References Cited

U.S. PATENT DOCUMENTS

| | | |
|---|---|---|
| 4,161,470 A | 7/1979 | Calundann |
| 4,162,466 A | 7/1979 | Hunsinger et al. |
| 4,458,039 A | 7/1984 | Eickman |
| 4,746,694 A | 5/1988 | Charbonneau et al. |
| 4,960,654 A | 10/1990 | Yoshinaka et al. |
| 5,032,627 A | 7/1991 | Wilson et al. |
| 5,348,990 A | 9/1994 | Walpita et al. |
| 5,541,240 A | 7/1996 | Makhija et al. |

(Continued)

FOREIGN PATENT DOCUMENTS

| | | |
|---|---|---|
| CN | 104961916 A | 10/2015 |
| CN | 104961922 A | 10/2015 |

(Continued)

OTHER PUBLICATIONS

Katsumi Takata, Ahn-Vu Pham, Kisarazu Chiba, Electical Properties and Practical applications of Liquid Crystal Polymer Flex, University of California Davis, CA (Year: 2007).*

(Continued)

*Primary Examiner* — Tanmay K Shah
(74) *Attorney, Agent, or Firm* — Dority & Manning, P.A.

(57) ABSTRACT

An RF filter comprising a resonator element and a polymer composition is provided. The polymer composition contains an aromatic polymer and has a melting temperature of about 240° C. or more. The polymer composition exhibits a dielectric constant of about 5 or less and dissipation factor of about 0.05 or less at a frequency of 10 GHz.

43 Claims, 9 Drawing Sheets

(56) References Cited

U.S. PATENT DOCUMENTS

| | | | |
|---|---|---|---|
| 5,616,680 A | 4/1997 | Linstid, III | |
| 5,624,984 A | 4/1997 | Furuta et al. | |
| 5,767,195 A | 6/1998 | Furuta et al. | |
| 6,114,492 A | 9/2000 | Linstid, III et al. | |
| 6,121,369 A | 9/2000 | Stack et al. | |
| 6,303,524 B1 | 10/2001 | Sharangpani et al. | |
| 6,346,864 B1 * | 2/2002 | Kadota | H03H 9/6463 333/133 |
| 6,350,822 B1 | 2/2002 | Van Diepen et al. | |
| 6,495,616 B2 | 12/2002 | Maeda | |
| 6,514,611 B1 | 2/2003 | Shepherd et al. | |
| 6,641,928 B2 | 11/2003 | Takeichi et al. | |
| 6,756,427 B2 | 6/2004 | Maeda | |
| 6,818,293 B1 | 11/2004 | Keep et al. | |
| 6,818,821 B2 | 11/2004 | Fujieda et al. | |
| 6,894,141 B2 | 5/2005 | Satoh et al. | |
| 6,984,712 B2 | 1/2006 | Ueno et al. | |
| 7,014,921 B2 | 3/2006 | Okamoto et al. | |
| 7,063,892 B2 | 6/2006 | Okamoto et al. | |
| 7,079,405 B2 | 7/2006 | Tobita et al. | |
| 7,148,311 B2 | 12/2006 | Benicewicz et al. | |
| 7,180,172 B2 | 2/2007 | Sethumadhaven et al. | |
| 7,223,807 B2 | 5/2007 | Okamoto et al. | |
| 7,239,261 B2 | 7/2007 | Fujieda et al. | |
| 7,247,590 B2 | 7/2007 | Kawabata et al. | |
| 7,314,898 B2 | 1/2008 | Downing, Jr. et al. | |
| 7,455,901 B2 | 11/2008 | Yano et al. | |
| 7,504,150 B2 | 3/2009 | Lee et al. | |
| 7,531,204 B2 | 5/2009 | Lee et al. | |
| 7,547,849 B2 | 6/2009 | Lee et al. | |
| 7,583,226 B2 | 9/2009 | Sakurada | |
| 7,618,553 B2 | 11/2009 | Kim et al. | |
| 7,648,758 B2 | 1/2010 | Morin | |
| 7,704,408 B2 | 5/2010 | Fuksatu | |
| 7,713,439 B2 | 5/2010 | Murouchi et al. | |
| 7,737,198 B2 | 6/2010 | Murouchi et al. | |
| 7,790,786 B2 | 9/2010 | Murouchi et al. | |
| 7,816,014 B2 | 10/2010 | Ito et al. | |
| 7,897,083 B2 | 3/2011 | Fukatsu et al. | |
| 7,985,351 B2 | 7/2011 | Yamauchi et al. | |
| 8,012,352 B1 | 9/2011 | Giraldo et al. | |
| 8,025,814 B2 | 9/2011 | Uehara et al. | |
| 8,043,527 B2 | 10/2011 | Iwase et al. | |
| 8,044,151 B2 | 10/2011 | Asahara et al. | |
| 8,066,907 B2 | 11/2011 | Kohinata et al. | |
| 8,192,645 B2 | 6/2012 | Murouchi et al. | |
| 8,222,802 B2 | 7/2012 | Saito et al. | |
| 8,226,851 B2 | 7/2012 | Harada et al. | |
| 8,231,807 B2 | 7/2012 | Yonezawa et al. | |
| 8,309,640 B2 | 11/2012 | Li et al. | |
| 8,337,719 B2 | 12/2012 | Hosoda et al. | |
| 8,425,798 B2 | 4/2013 | Saito et al. | |
| 8,475,924 B2 | 7/2013 | Lee et al. | |
| 8,492,464 B2 | 7/2013 | Li et al. | |
| 8,545,718 B2 | 10/2013 | Nakayama et al. | |
| 8,580,145 B2 | 11/2013 | Osato et al. | |
| 8,641,924 B2 | 2/2014 | Sekimura et al. | |
| 8,642,682 B2 | 2/2014 | Nishihata | |
| 8,692,272 B2 | 4/2014 | Matsumi et al. | |
| 8,703,011 B2 | 4/2014 | Wang et al. | |
| 8,715,526 B2 | 5/2014 | Kitai et al. | |
| 8,816,019 B2 | 8/2014 | Ganguly et al. | |
| 8,841,367 B2 | 9/2014 | Zheng et al. | |
| 8,883,900 B2 | 11/2014 | Jiang et al. | |
| 8,894,880 B2 | 11/2014 | Shin et al. | |
| 8,895,649 B2 | 11/2014 | Li et al. | |
| 8,926,862 B2 | 1/2015 | Kim et al. | |
| 8,927,661 B2 | 1/2015 | Li et al. | |
| 8,946,333 B2 | 2/2015 | Raman et al. | |
| 8,992,805 B2 | 3/2015 | Nishimura et al. | |
| 9,018,286 B2 | 4/2015 | Daga et al. | |
| 9,023,923 B2 | 5/2015 | An et al. | |
| 9,074,070 B2 | 7/2015 | Yung et al. | |
| 9,185,800 B2 | 11/2015 | Meng et al. | |
| 9,234,092 B2 | 1/2016 | Nakayama et al. | |
| 9,258,892 B2 | 2/2016 | Crosley | |
| 9,283,707 B2 | 3/2016 | Saito et al. | |
| 9,355,753 B2 | 5/2016 | Kim | |
| 9,394,483 B2 | 7/2016 | Wu et al. | |
| 9,397,377 B2 | 7/2016 | Seo et al. | |
| 9,538,646 B2 | 1/2017 | Onodera et al. | |
| 9,574,065 B2 | 2/2017 | Miyamoto et al. | |
| 9,790,344 B2 | 10/2017 | Doi | |
| 9,850,343 B2 | 12/2017 | Konishi et al. | |
| 9,896,566 B2 | 2/2018 | Yung et al. | |
| 9,944,768 B2 | 4/2018 | Cheng et al. | |
| 9,982,113 B2 | 5/2018 | Kniess et al. | |
| 9,985,329 B2 | 5/2018 | Raihn et al. | |
| 10,027,310 B2 | 7/2018 | Tsuzuki et al. | |
| 10,106,682 B2 | 10/2018 | Kim | |
| 10,109,903 B2 | 10/2018 | Huang et al. | |
| 10,119,021 B2 | 11/2018 | Li et al. | |
| 10,150,863 B2 | 12/2018 | Wu et al. | |
| 10,174,180 B2 | 1/2019 | Bao et al. | |
| 10,233,301 B2 | 3/2019 | Kato et al. | |
| 10,273,362 B2 | 4/2019 | Zhang et al. | |
| 10,287,473 B2 | 5/2019 | Esseghir et al. | |
| 10,290,389 B2 | 5/2019 | Wu et al. | |
| 10,329,422 B2 | 6/2019 | Li et al. | |
| 10,333,493 B2 | 6/2019 | Nagarkar et al. | |
| 10,604,649 B2 | 3/2020 | Yamanaka | |
| 10,696,787 B2 | 6/2020 | Takasuka et al. | |
| 10,697,065 B2 | 6/2020 | Hua et al. | |
| 10,714,810 B2 | 7/2020 | Hong et al. | |
| 10,741,932 B2 | 8/2020 | Thai et al. | |
| 10,767,049 B2 | 9/2020 | Kim | |
| 10,784,030 B2 | 9/2020 | Lee et al. | |
| 10,822,452 B2 | 11/2020 | Tsuchiya et al. | |
| 10,822,453 B2 | 11/2020 | Washino | |
| 10,899,900 B2 | 1/2021 | Jung et al. | |
| 10,968,311 B2 | 4/2021 | Washino | |
| 10,968,347 B2 | 4/2021 | Akiyama et al. | |
| 11,028,250 B2 | 6/2021 | Zhang et al. | |
| 11,075,442 B2 | 7/2021 | Wang et al. | |
| 11,505,647 B2 | 11/2022 | Washino | |
| 11,674,083 B2 | 6/2023 | Konno et al. | |
| 2004/0165390 A1 | 8/2004 | Sato et al. | |
| 2004/0214984 A1 * | 10/2004 | Keep | C08L 67/02 528/359 |
| 2005/0130447 A1 | 6/2005 | Takaya et al. | |
| 2007/0010647 A1 | 1/2007 | Ueno et al. | |
| 2007/0057236 A1 | 3/2007 | Hosoda et al. | |
| 2010/0012354 A1 | 1/2010 | Hedin et al. | |
| 2010/0051999 A1 | 3/2010 | Iwase et al. | |
| 2010/0053972 A1 | 3/2010 | Nakayama | |
| 2010/0263919 A1 | 10/2010 | Lee et al. | |
| 2010/0327728 A1 | 12/2010 | Saito et al. | |
| 2012/0040128 A1 | 2/2012 | Finn | |
| 2012/0249266 A1 | 10/2012 | Lim et al. | |
| 2012/0276390 A1 | 11/2012 | Ji et al. | |
| 2013/0309500 A1 * | 11/2013 | Doi | C08L 71/00 428/407 |
| 2014/0060899 A1 | 3/2014 | Park et al. | |
| 2014/0128545 A1 | 5/2014 | Xiong et al. | |
| 2014/0142571 A1 | 5/2014 | Yung et al. | |
| 2014/0159285 A1 | 6/2014 | Choi | |
| 2014/0171567 A1 | 6/2014 | Guo et al. | |
| 2014/0296411 A1 | 10/2014 | Cheng et al. | |
| 2014/0353543 A1 | 12/2014 | Wu et al. | |
| 2015/0337132 A1 | 11/2015 | Van der Burgt | |
| 2016/0116948 A1 | 4/2016 | Ou et al. | |
| 2016/0301141 A1 | 10/2016 | Del Castillo et al. | |
| 2017/0002193 A1 | 1/2017 | Cheng et al. | |
| 2017/0273179 A1 | 9/2017 | Kim | |
| 2017/0361584 A1 | 12/2017 | Feng et al. | |
| 2017/0362731 A1 | 12/2017 | Wang et al. | |
| 2017/0367182 A1 | 12/2017 | Wu et al. | |
| 2018/0215894 A1 | 8/2018 | Cheng et al. | |
| 2018/0230294 A1 | 8/2018 | Cheng et al. | |
| 2018/0332710 A1 | 11/2018 | Lin et al. | |
| 2018/0346711 A1 | 12/2018 | Van der Burgt et al. | |
| 2018/0355150 A1 | 12/2018 | Kim | |
| 2018/0362758 A1 | 12/2018 | Wu et al. | |
| 2019/0027813 A1 | 1/2019 | Wang | |

(56) References Cited

U.S. PATENT DOCUMENTS

| | | |
|---|---|---|
| 2019/0031879 A1 | 1/2019 | Ding et al. |
| 2019/0153216 A1 | 5/2019 | Gong et al. |
| 2019/0237851 A1 | 8/2019 | Gu |
| 2019/0269012 A1 | 8/2019 | Van der Burgt |
| 2019/0322861 A1 | 10/2019 | Wei et al. |
| 2019/0341696 A1 | 11/2019 | O'Connor et al. |
| 2019/0352501 A1 | 11/2019 | Wang et al. |
| 2019/0352503 A1 | 11/2019 | Cheng et al. |
| 2020/0017769 A1 | 1/2020 | Konno et al. |
| 2020/0022264 A1 | 1/2020 | Cheng et al. |
| 2020/0040133 A1 | 2/2020 | Washino |
| 2020/0076035 A1 | 3/2020 | Huh et al. |
| 2020/0091608 A1 | 3/2020 | Alpman et al. |
| 2020/0219861 A1 * | 7/2020 | Kamgaing ........... H03H 9/0561 |
| 2020/0299582 A1 | 9/2020 | Komatsu |
| 2020/0308487 A1 | 10/2020 | Hegi |
| 2020/0347224 A1 | 11/2020 | Hara |
| 2020/0369884 A1 | 11/2020 | Lee et al. |
| 2020/0399465 A1 | 12/2020 | Hara |
| 2021/0002507 A1 | 1/2021 | Azami et al. |
| 2021/0024687 A1 | 1/2021 | Ohtomo et al. |
| 2021/0024701 A1 | 1/2021 | Wang et al. |
| 2021/0054190 A1 | 2/2021 | Kim |
| 2021/0057811 A1 | 2/2021 | Kim |
| 2021/0057827 A1 | 2/2021 | Kim et al. |
| 2021/0070927 A1 | 3/2021 | Zhang et al. |
| 2021/0070929 A1 | 3/2021 | Kim et al. |
| 2021/0070983 A1 | 3/2021 | Kim et al. |
| 2021/0075093 A1 | 3/2021 | Zhang et al. |
| 2021/0075162 A1 | 3/2021 | Kim et al. |
| 2021/0092836 A1 | 3/2021 | Zhang et al. |
| 2021/0130585 A1 | 5/2021 | Wang et al. |
| 2021/0130604 A1 | 5/2021 | Ramakrishnan et al. |
| 2021/0143539 A1 | 5/2021 | Yuan et al. |
| 2021/0251074 A1 | 8/2021 | Onodera et al. |
| 2021/0269588 A1 | 9/2021 | Washino |
| 2021/0274652 A1 | 9/2021 | Kim |
| 2021/0292475 A1 | 9/2021 | Konishi et al. |
| 2022/0073732 A1 | 3/2022 | Washino |

FOREIGN PATENT DOCUMENTS

| | | | |
|---|---|---|---|
| CN | 105504247 A | 4/2016 | |
| CN | 105542408 A | 5/2016 | |
| CN | 106633680 A | 5/2017 | |
| CN | 106633859 A | 5/2017 | |
| CN | 107022171 A | 8/2017 | |
| CN | 105623206 B | 12/2017 | |
| CN | 108045022 A | 5/2018 | |
| CN | 108102314 A | 6/2018 | |
| CN | 108178906 A | 6/2018 | |
| CN | 108250692 A | 7/2018 | |
| CN | 207772540 U | 8/2018 | |
| CN | 105860036 B | 9/2018 | |
| CN | 108148433 A | 12/2018 | |
| CN | 109301507 A | 2/2019 | |
| CN | 109467643 A | 3/2019 | |
| CN | 109467722 A | 3/2019 | |
| CN | 109509975 A | 3/2019 | |
| CN | 208675597 U | 3/2019 | |
| CN | 106633860 B | 4/2019 | |
| CN | 106750198 B | 5/2019 | |
| CN | 109735060 A | 5/2019 | |
| CN | 109742534 A | 5/2019 | |
| CN | 109755729 A | 5/2019 | |
| CN | 109755733 A | 5/2019 | |
| CN | 109790361 A | 5/2019 | |
| CN | 208904227 U | 5/2019 | |
| CN | 110154464 A | 8/2019 | |
| CN | 209266563 U | 8/2019 | |
| CN | 209266570 U | 8/2019 | |
| CN | 209266571 U | 8/2019 | |
| CN | 108884329 B | 10/2019 | |
| CN | 209516005 U | 10/2019 | |
| CN | 209544599 U | 10/2019 | |
| CN | 110505753 A | 11/2019 | |
| CN | 110746754 A | 2/2020 | |
| CN | 110769594 A | 2/2020 | |
| CN | 110177821 B | 3/2020 | |
| CN | 110903612 A | 3/2020 | |
| CN | 111087765 A | 5/2020 | |
| CN | 111087797 A | 5/2020 | |
| CN | 111117169 A | 5/2020 | |
| CN | 111286176 A | 6/2020 | |
| CN | 111320848 A | 6/2020 | |
| CN | 210706390 U | 6/2020 | |
| CN | 111393806 A | 7/2020 | |
| CN | 110603278 B | 2/2021 | |
| CN | 109705322 B | 9/2021 | |
| CN | 109661433 B | 5/2022 | |
| CN | 111936547 B | 5/2022 | |
| EP | 2 774 952 B1 | 9/2014 | |
| EP | 2 981 573 B1 | 6/2018 | |
| EP | 3 674 080 A1 | 7/2020 | |
| EP | 3 674 368 A1 | 7/2020 | |
| EP | 3 730 545 A1 | 10/2020 | |
| JP | 2003268089 A | 9/2003 | |
| JP | 2003268241 A | 9/2003 | |
| JP | 2004143270 A | 5/2004 | |
| JP | 2004277539 A | 10/2004 | |
| JP | 2004323705 A | 11/2004 | |
| JP | 2005078806 A | 3/2005 | |
| JP | 4945097 B2 | 1/2007 | |
| JP | 2007154169 A | 6/2007 | |
| JP | 2007273537 A | 10/2007 | |
| JP | 2009114418 A | 5/2009 | |
| JP | 4339966 B2 | 10/2009 | |
| JP | 2010254875 A | 11/2010 | |
| JP | 2011052037 A | 3/2011 | |
| JP | 2011093973 A | 5/2011 | |
| JP | 2013108008 A | 6/2013 | |
| JP | 5280281 B2 | 9/2013 | |
| JP | 5332081 B2 | 11/2013 | |
| JP | 2015059178 A | 3/2015 | |
| JP | 5866423 B2 | 2/2016 | |
| JP | 2016041828 A | 3/2016 | |
| JP | 5919613 B2 | 5/2016 | |
| JP | 5924527 B2 | 5/2016 | |
| JP | 2017095625 A | 6/2017 | |
| JP | 2017119378 A | 7/2017 | |
| JP | 2017120826 A | 7/2017 | |
| JP | 6177191 B2 | 8/2017 | |
| JP | 6181587 B2 | 8/2017 | |
| JP | 2017179127 A | 10/2017 | |
| JP | 2018016753 A | 2/2018 | |
| JP | 2018016754 A | 2/2018 | |
| JP | 2018029187 A | 2/2018 | |
| JP | 6295013 B2 | 3/2018 | |
| JP | 2018030948 A | 3/2018 | |
| JP | 6306369 B2 | 4/2018 | |
| JP | 6359225 B2 | 7/2018 | |
| JP | 2018109090 A | 7/2018 | |
| JP | 6405817 B2 | 10/2018 | |
| JP | 6405818 B2 | 10/2018 | |
| JP | 2018168320 A | 11/2018 | |
| JP | 2019006973 A | 1/2019 | |
| JP | 6470295 B2 | 2/2019 | |
| JP | 2019065263 A | 4/2019 | |
| JP | 6533880 B1 | 6/2019 | |
| JP | 6533881 B1 | 6/2019 | |
| JP | 2019094489 A | 6/2019 | |
| JP | 2019094497 A | 6/2019 | |
| JP | 2019099618 A | 6/2019 | |
| JP | 2019106434 A | 6/2019 | |
| JP | 2019116586 A | 7/2019 | |
| JP | 2019127556 A | 8/2019 | |
| JP | 2019127557 A | 8/2019 | |
| JP | 6574281 B2 | 9/2019 | |
| JP | 6576754 B2 | 9/2019 | |
| JP | 6576808 B2 | 9/2019 | |
| JP | 2019189734 A | 10/2019 | |
| JP | 2019189735 A | 10/2019 | |
| JP | 2019189736 A | 10/2019 | |
| JP | 2019189737 A | 10/2019 | |

(56) References Cited

FOREIGN PATENT DOCUMENTS

| | | | |
|---|---|---|---|
| JP | 6773824 | B2 | 10/2020 |
| JP | 6837189 | B1 | 3/2021 |
| JP | 6854124 | B2 | 4/2021 |
| JP | 6900151 | B2 | 7/2021 |
| JP | 6930784 | B2 | 9/2021 |
| JP | 6998189 | B2 | 1/2022 |
| JP | 7116546 | B2 | 8/2022 |
| JP | 7159693 | B2 | 10/2022 |
| KR | 20140074094 | A | 6/2014 |
| KR | 20140074095 | A | 6/2014 |
| KR | 101757308 | B1 | 7/2017 |
| KR | 101792873 | B1 | 11/2017 |
| KR | 101817365 | B1 | 1/2018 |
| KR | 101817366 | B1 | 1/2018 |
| KR | 101834703 | B1 | 3/2018 |
| KR | 102104752 | B1 | 4/2020 |
| KR | 102104753 | B1 | 4/2020 |
| KR | 20200070501 | A | 6/2020 |
| KR | 102167337 | B1 | 10/2020 |
| WO | WO 2004/058851 | A1 | 7/2004 |
| WO | WO 2014/162254 | A1 | 10/2014 |
| WO | WO 2014/180550 | A1 | 11/2014 |
| WO | WO 2014/203227 | A2 | 12/2014 |
| WO | WO 2017/029608 | A1 | 2/2017 |
| WO | WO 2018/026601 | A1 | 2/2018 |
| WO | WO 2018/038093 | A1 | 3/2018 |
| WO | WO 2018/056294 | A1 | 3/2018 |
| WO | WO 2018/141769 | A1 | 8/2018 |
| WO | WO 2019/042906 | A1 | 3/2019 |
| WO | WO 2019/213920 | A1 | 11/2019 |
| WO | WO 2020/095997 | A1 | 5/2020 |
| WO | WO 2020/194196 | A1 | 10/2020 |
| WO | WO 2020/217225 | A1 | 10/2020 |

OTHER PUBLICATIONS

Liquid Crystal Polymers, Technical Articles (Year: 2006).*
Amato, Ing. Francesco, Ph.D., "A Primer on 5G," Jan. 11, 2019, 19 pages.
Bjornson, Emil, "Massive MIMO for 5G," Tutorial at 2015 IEEE International Workshop on Signal Processing Advances in Wireless Communications, (SPAWC), Jun. 29, Stockholm, Sweden 58 pages.
Hassan et al., Massive MIMO Wireless Networks: An Overview, *Electronics*, 2017, 6, 63, pp. 1-29.
Hong et al., "mmWave Measurement of RF Reflectors for 5G Green Communications," *Hindawi Wireless Communications and Mobile Computing*, vol. 2018, Article ID 8217839, May 15, 2018, 10 pages.
Jilani et al., "Millimeter-wave Liquid Crystal Polymer Based Antenna Array for Conformal 5G Applications," *IEEE Antennas and Wireless Propagation Letters*, vol. 18, Issue 1, Jan. 2019, pp. 84-88.
Paper—The Fifth Generation of Wireless Network Communications from TE Connectivity, Apr. 2019, 20 pages.
Paper—Material Solutions for 5G Applications from SABIC, 2018, 4 pages.
Takata, et al., "Electrical properties and practical applications of Liquid Crystal Polymer flex," *IEEE Polytronic 2007 Conference*, pp. 67-72.
Technical Article—Plastic Materials—Liquid Crystal Polymers from Steinwall Plastic Injection Molding, May 2016, 3 pages.
Theil et al., "The Effect of Thermal Cycling on a-C:F,H Low Dielectric Constant Films Deposited by ECR Plasma Enhanced Chemical Vapor Deposition," *Proceedings for the International Interconnect Technology Conference*, Jun. 1998, p. 128-131, 3 pages.
International Search Report and Written Opinion for PCT/US2020/046929 dated Nov. 3, 2020, 9 pages.
Related Application Form.

* cited by examiner

RF FILTER FOR USE AT 5G FREQUENCIES

CROSS REFERENCE TO RELATED APPLICATIONS

The present application is a continuation1 of U.S. Application Ser. No. 16/995,918 having a filing date of Aug. 18, 2020, which claims filing benefit of United States Provisional Patent Application Ser. No. 62/904,109 having a filing date of Sep. 23, 2019; U.S. Provisional Patent Application Ser. No. 63/009,007 having a filing date of Apr. 13, 2020; and U.S. Provisional Application Ser. No. 63/024,574 having a filing date of May 14, 2020, which are incorporated herein by reference in their entirety.

BACKGROUND OF THE INVENTION

Radiofrequency ("RF") interference is a significant issue for any wireless communication platform. To help address these issues, RF filters (e.g., acoustic filters, cavity filters, etc.) are often employed to filter the transmit and receive paths for 2G, 3G, and 4G wireless access methods in up to 15 bands, as well as Wi-Fi, Bluetooth and the receive path of GPS receivers. As the transition occurs to 5G applications, however, such filters are exposed to higher frequencies, which can result in an increased amount of power consumption and heat generation. Consequently, most conventional RF filters are not adequate for 5G applications due to the high frequency performance capability requirements. Thus, a need exists for improved RF filters for use in 5G antenna systems.

SUMMARY OF THE INVENTION

In accordance with one embodiment of the present invention, an RF filter is disclosed that comprises a resonator element and a polymer composition. The polymer composition contains an aromatic polymer and has a melting temperature of about 240° C. or more. The polymer composition exhibits a dielectric constant of about 5 or less and dissipation factor of about 0.05 or less at a frequency of 10 GHz.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
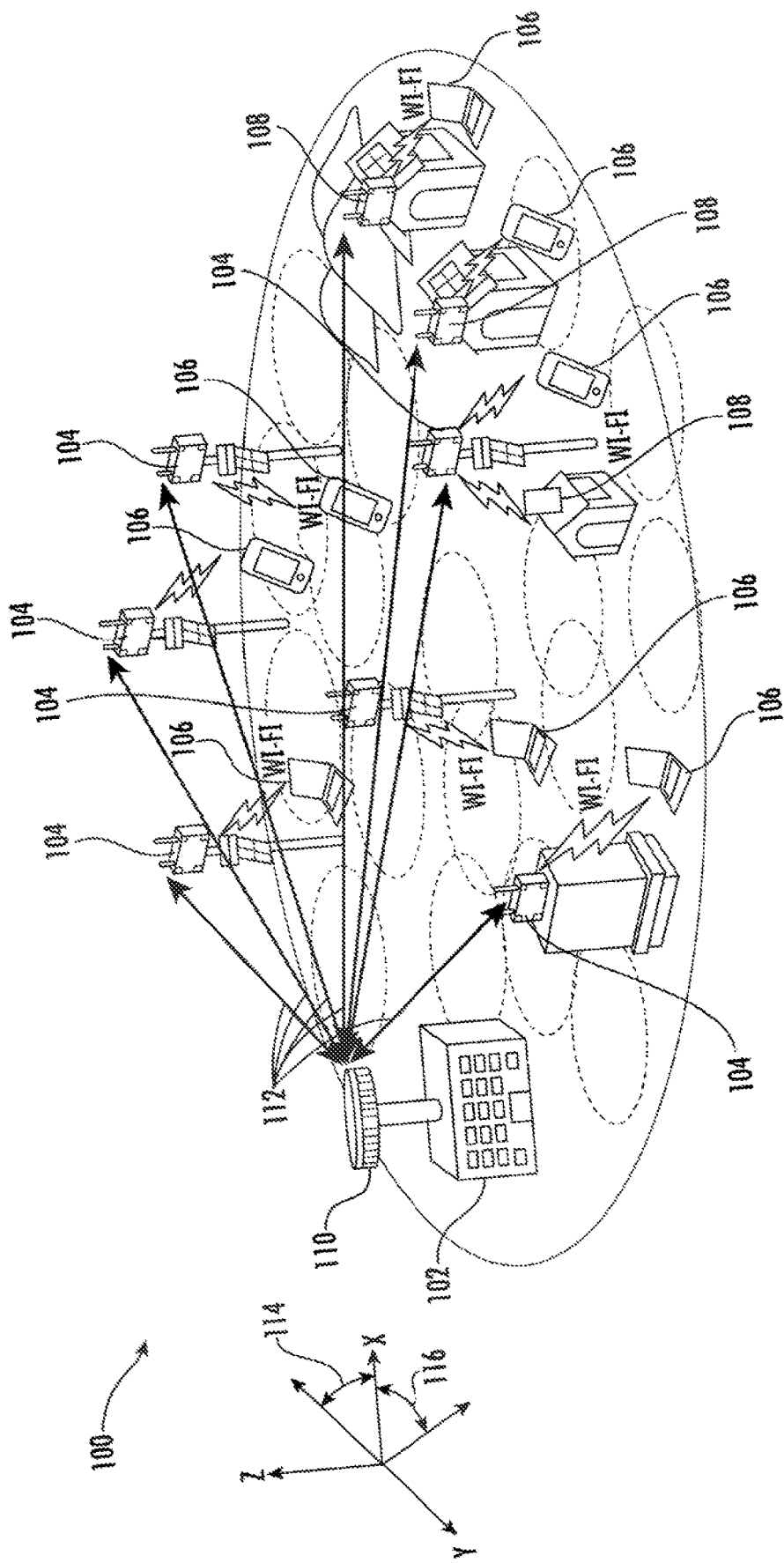
FIG. 1 depicts one embodiment of a 5G antenna system that can be employed in the present invention.

It is to be understood by one of ordinary skill in the art that the present discussion is a description of exemplary embodiments only, and is not intended as limiting the broader aspects of the present invention.

Generally speaking, the present invention is directed to a radiofrequency filter ("RF") for use in 5G applications, such as an acoustic filter or cavity filter. The RF filter typically includes one or more resonator elements (e.g., piezoelectric material, dielectric material, etc.), which can produce resonant behavior over a narrow frequency band in the desired 5G frequency, such as about 2.5 GHz or higher, in some embodiments about 3.0 GHz or higher, in some embodiments from about 3 GHz to about 300 GHz, or higher, in some embodiments from about 4 GHz to about 80 GHz, in some embodiments from about 5 GHz to about 80 GHz, in some embodiments from about 20 GHz to about 80 GHz, and in some embodiments from about 28 GHz to about 60 GHz. Notably, in accordance with the present invention, a polymer composition is employed in the RF filter (e.g., substrate, housing, etc.) that exhibits a low dielectric constant and dissipation factor over a wide range of frequencies, making it particularly suitable for use in 5G applications. That is, the polymer composition may exhibit a low dielectric constant of about 5 or less, in some embodiments about 4.5 or less, in some embodiments from about 0.1 to about 4.4 and in some embodiments, from about 1 to about 4.2, in some embodiments, from about 1.5 to about 4, in some embodiments from about 2 to about 3.9, and in some embodiments, from about 3.5 to about 3.9 over typical 5G frequencies (e.g., 2 or 10 GHz). The dissipation factor of the polymer composition, which is a measure of the loss rate of energy, may likewise be about 0.05 or less, in some embodiments about 0.01 or less, in some embodiments from about 0.0001 to about 0.008, and in some embodiments from about 0.0002 to about 0.006 over typical 5G frequencies (e.g., 2 or 10 GHz). In fact, in some cases, the dissipation factor may be very low, such as about 0.003 or less, in some embodiments about 0.002 or less, in some embodiments about 0.001 or less, in some embodiments, about 0.0009 or less, in some embodiments about 0.0008 or less, and in some embodiments, from about 0.0001 to about 0.0007 over typical 5G frequencies (e.g., 2 or 10 GHz).

Conventionally, it was believed that polymer compositions exhibiting a low dissipation factor and dielectric constant would not also possess sufficiently good thermal, mechanical properties and ease in processing (i.e., low viscosity) to enable their use in certain types of applications. Contrary to conventional thought, however, the polymer composition has been found to possess both excellent thermal, mechanical properties and processability. For example, the melting temperature of the polymer composition may, for instance, be about 240° C. or more, in some embodiments about 260° C., in some embodiments from about 280° C. to about 400° C., and in some embodiments, from about 250° C. to about 380° C. Even at such melting temperatures, the ratio of the deflection temperature under load ("DTUL"), a measure of short term heat resistance, to the melting temperature may still remain relatively high. For example, the ratio may range from about 0.5 to about 1.00, in some embodiments from about 0.6 to about 0.95, and in some embodiments from about 0.65 to about 0.85. The specific DTUL values may, for instance, be about 200° C. or more, in some embodiments from about 200° C. to about 350° C., in some embodiments from about 210° C. to about 320° C., and in some embodiments from about 230° C. to about 310° C. Such high DTUL values can, among other things, allow the use of high speed and reliable surface mounting processes for mating the structure with other components of the electrical component.

The polymer composition may also possess excellent mechanical properties. For example, the polymer composition may exhibit a tensile strength of about 10 MPa or more, in some embodiments about 50 MPa or more, in some embodiments from about 70 MPa to about 300 MPa, and in some embodiments from about 80 MPa to about 200 MPa. The polymer composition may exhibit a tensile elongation of about 0.3% or more, in some embodiments about 0.4% or more, in some embodiments from about 0.5% to about 4%, and in some embodiments from about 0.5% to about 2%. The polymer composition may exhibit a tensile modulus of about 5,000 MPa or more, in some embodiments about 6,000 MPa or more, in some embodiments about 7,000 MPa to about 25,000 MPa, and in some embodiments from about 10,000 MPa to about 20,000 MPa. The tensile properties may be determined at a temperature of 23° C. in accordance with ISO Test No. 527:2012. Also, the polymer composition may exhibit a flexural strength of about 20 MPa or more, in some embodiments about 30 MPa or more, in some embodiments about 50 MPa or more, in some embodiments from about 70 MPa to about 300 MPa, and in some embodiments from about 80 MPa to about 200 MPa. The polymer composition may exhibit a flexural elongation of about 0.4% or more, in some embodiments from about 0.5% to about 4%, and in some embodiments from about 0.5% to about 2%. The polymer composition may exhibit a flexural modulus of about 5,000 MPa or more, in some embodiments about 6,000 MPa or more, in some embodiments about 7,000 MPa to about 25,000 MPa, and in some embodiments from about 10,000 MPa to about 20,000 MPa. The flexural properties may be determined at a temperature of 23° C. in accordance with 178:2010. Furthermore, the polymer composition may also possess a high impact strength, which may be useful when forming thin substrates. The polymer composition may, for instance, possess a Charpy notched impact strength of about 3 kJ/m$^2$ or more, in some embodiments about 5 kJ/m$^2$ or more, in some embodiments about 7 kJ/m$^2$ or more, in some embodiments from about 8 kJ/m$^2$ to about 40 kJ/m$^2$, and in some embodiments from about 10 kJ/m$^2$ to about 25 kJ/m$^2$. The impact strength may be determined at a temperature of 23° C. in accordance with ISO Test No. ISO 179-1:2010.

Various embodiments of the present invention will now be described in more detail.

I. Polymer Composition

A. Aromatic Polymer

Generally speaking, the polymer composition contains one or more aromatic polymers. Such polymers are generally considered "high performance" polymers in that they are selected to have a relatively high glass transition temperature and/or high melting temperature such that they provide a substantial degree of heat resistance to the polymer composition. For example, the polymer may have a melting temperature of about 240° C. or more, in some embodiments about 260° C., in some embodiments from about 280° C. to about 400° C., and in some embodiments, from about 250° C. to about 380° C. The aromatic polymer may also have a glass transition temperature of about 30° C. or more, in some embodiments about 40° C. or more, in some embodiments from about 50° C. to about 250° C., in some embodiments from about 60° C. to about 150° C. The glass transition and melting temperatures may be determined as is well known in the art using differential scanning calorimetry ("DSC"), such as determined by ISO Test No. 11357-2:2013 (glass transition) and 11357-3:2011 (melting).

Polyarylene sulfides, for instance, are suitable semi-crystalline aromatic polymers for use in the polymer composition. The polyarylene sulfide may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

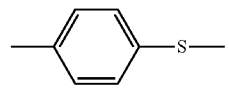

and segments having the structure of formula:

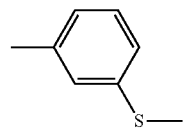

or segments having the structure of formula:

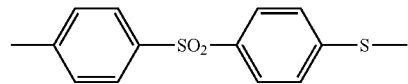

The polyarylene sulfide may be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula R'X$_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

In addition to the polymers referenced above, crystalline polymers may also be employed in the polymer composition. Particularly suitable are liquid crystalline polymers, which have a high degree of crystallinity that enables them to effectively fill small spaces. Liquid crystalline polymers are generally classified as "thermotropic" to the extent that they can possess a rod-like structure and exhibit a crystalline behavior in their molten state (e.g., thermotropic nematic state). The liquid crystalline polymers employed in the polymer composition typically have a melting temperature of from about 200° C. to about 400° C., in some embodiments from about 250° C. to about 380° C., in some embodiments from about 270° C. to about 360° C., and in some embodiments from about 300° C. to about 350° C. Such polymers may be formed from one or more types of repeating units as is known in the art. A liquid crystalline polymer may, for example, contain one or more aromatic ester repeating units generally represented by the following Formula (I):

(I)

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 40 mol. % or more, in some embodiments about 50 mole % or more, in some embodiments from about 55 mol. % to 100 mol. %, and in some embodiments, from about 60 mol. % to about 95 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl) ethane, bis(3-carboxyphenyl)ether, bis(3-carboxyphenyl) ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 1 mol. % to about 40 mol. %, in some embodiments from about 2 mol. % to about 30 mol. %, and in some embodiments, from about 5 mol. % to about 25% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) typically constitute from about 1 mol. % to about 40 mol. %, in some embodiments from about 2 mol. % to about 30 mol. %, and in some embodiments, from about 5 mol. % to about 25% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

Although not necessarily required, the liquid crystalline polymer may be a "high naphthenic" polymer to the extent that it contains a relatively high content of repeating units derived from naphthenic hydroxycarboxylic acids and naphthenic dicarboxylic acids, such as NDA, HNA, or combinations thereof. That is, the total amount of repeating units derived from naphthenic hydroxycarboxylic and/or dicarboxylic acids (e.g., NDA, HNA, or a combination of HNA and NDA) is typically about 10 mol. % or more, in some embodiments about 12 mol. % or more, in some embodiments about 15 mol. % or more, in some embodiments about 18 mol. % or more, in some embodiments about 20 mol. % or more, in some embodiments about 30 mol. % or more, in some embodiments about 40 mol. % or more, in some embodiments about 45 mol. % or more, in some embodiments about 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. Without intending to be limited by theory, it is believed that such "high naphthenic" polymers are capable of reducing the tendency of the polymer composition to absorb water, which can help stabilize the dielectric constant and dissipation factor at high frequency ranges. Namely, such high naphthenic polymers typically have a water adsorption of about 0.015% or less, in some embodiments about 0.01% or less, and in some embodiments, from about 0.0001% to about 0.008% after being immersed in water for 24 hours in accordance with ISO 62-1:2008. The high naphthenic polymers may also have a moisture adsorption of about 0.01% or less, in some embodiments about 0.008% or less, and in some embodiments, from about 0.0001% to about 0.006% after being exposed to a humid atmosphere (50% relative humidity) at a temperature of 23° C. in accordance with ISO 62-4:2008.

In one embodiment, for instance, the repeating units derived from HNA may constitute 30 mol. % or more, in some embodiments about 40 mol. % or more, in some embodiments about 45 mol. % or more, in some embodiments 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. The liquid crystalline polymer may also contain various other monomers. For example, the polymer may contain repeating units derived from HBA in an amount of from about 10 mol. % to about 40 mol. %, and in some embodiments from about 15 mol. % to about 35 mol. %, and in some embodiments, from about 20 mol. % to about 30 mol. %. When employed, the molar ratio of HNA to HBA may be selectively controlled within a specific range to help achieve the desired properties, such as from about 0.1 to about 40, in some embodiments from about 0.5 to about 20, in some embodiments from about 0.8 to about 10, and in some embodiments, from about 1 to about 5. The polymer may also contain aromatic dicarboxylic acid(s) (e.g., IA and/or TA) in an amount of from about 1 mol. % to about 40 mol. %, and in some embodiments, from about 5 mol. % to about 25 mol. %; and/or aromatic diol(s) (e.g., BP and/or HQ) in an amount of from about 1 mol. % to about 40 mol. %, and in some embodiments from about 5 mol. % to about 25 mol. %. In some cases, however, it may be desired to minimize the presence of such monomers in the polymer to help achieve the desired properties. For example, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer. Similarly, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer (e.g., 0 mol. %).

In another embodiment, the repeating units derived from NDA may constitute 10 mol. % or more, in some embodiments about 12 mol. % or more, in some embodiments about 15 mol. % or more, and in some embodiments, from about 18 mol. % to about 95 mol. % of the polymer. In such embodiments, the liquid crystalline polymer may also contain various other monomers, such as aromatic hydroxycarboxylic acid(s) (e.g., HBA) in an amount of from about 20 mol. % to about 60 mol. %, and in some embodiments, from about 30 mol. % to about 50 mol. %; aromatic dicarboxylic acid(s) (e.g., IA and/or TA) in an amount of from about 2 mol. % to about 30 mol. %, and in some embodiments, from about 5 mol. % to about 25 mol. %; and/or aromatic diol(s) (e.g., BP and/or HQ) in an amount of from about 2 mol. % to about 40 mol. %, and in some embodiments, from about 5 mol. % to about 35 mol. %.

Regardless of the particular constituents and nature of the polymer, the liquid crystalline polymer may be prepared by initially introducing the aromatic monomer(s) used to form the ester repeating units (e.g., aromatic hydroxycarboxylic acid, aromatic dicarboxylic acid, etc.) and/or other repeating units (e.g., aromatic diol, aromatic amide, aromatic amine, etc.) into a reactor vessel to initiate a polycondensation reaction. The particular conditions and steps employed in such reactions are well known, and may be described in more detail in U.S. Pat. No. 4,161,470 to Calundann; U.S. Pat. No. 5,616,680 to Linstid, III, et al.; U.S. Pat. No. 6,114,492 to Linstid, III, et al.; U.S. Pat. No. 6,514,611 to Shepherd, et al.; and WO 2004/058851 to Waggoner. The vessel employed for the reaction is not especially limited, although it is typically desired to employ one that is commonly used in reactions of high viscosity fluids. Examples of such a reaction vessel may include a stirring tank-type apparatus that has an agitator with a variably-shaped stirring blade, such as an anchor type, multistage type, spiral-ribbon type, screw shaft type, etc., or a modified shape thereof. Further examples of such a reaction vessel may include a mixing apparatus commonly used in resin kneading, such as a kneader, a roll mill, a Banbury mixer, etc.

If desired, the reaction may proceed through the acetylation of the monomers as known the art. This may be accomplished by adding an acetylating agent (e.g., acetic anhydride) to the monomers. Acetylation is generally initiated at temperatures of about 90° C. During the initial stage of the acetylation, reflux may be employed to maintain vapor phase temperature below the point at which acetic acid byproduct and anhydride begin to distill. Temperatures during acetylation typically range from between 90° C. to 150° C., and in some embodiments, from about 110° C. to about 150° C. If reflux is used, the vapor phase temperature typically exceeds the boiling point of acetic acid, but remains low enough to retain residual acetic anhydride. For example, acetic anhydride vaporizes at temperatures of about 140° C. Thus, providing the reactor with a vapor phase reflux at a temperature of from about 110° C. to about 130° C. is particularly desirable. To ensure substantially complete reaction, an excess amount of acetic anhydride may be employed. The amount of excess anhydride will vary depending upon the particular acetylation conditions employed, including the presence or absence of reflux. The use of an excess of from about 1 to about 10 mole percent of acetic anhydride, based on the total moles of reactant hydroxyl groups present is not uncommon.

Acetylation may occur in in a separate reactor vessel, or it may occur in situ within the polymerization reactor vessel. When separate reactor vessels are employed, one or more of the monomers may be introduced to the acetylation reactor and subsequently transferred to the polymerization reactor. Likewise, one or more of the monomers may also be directly introduced to the reactor vessel without undergoing pre-acetylation.

In addition to the monomers and optional acetylating agents, other components may also be included within the reaction mixture to help facilitate polymerization. For instance, a catalyst may be optionally employed, such as metal salt catalysts (e.g., magnesium acetate, tin(I) acetate, tetrabutyl titanate, lead acetate, sodium acetate, potassium acetate, etc.) and organic compound catalysts (e.g., N-methylimidazole). Such catalysts are typically used in amounts of from about 50 to about 500 parts per million based on the total weight of the recurring unit precursors. When separate reactors are employed, it is typically desired to apply the catalyst to the acetylation reactor rather than the polymerization reactor, although this is by no means a requirement.

The reaction mixture is generally heated to an elevated temperature within the polymerization reactor vessel to initiate melt polycondensation of the reactants. Polycondensation may occur, for instance, within a temperature range of from about 250° C. to about 380° C., and in some embodiments, from about 280° C. to about 380° C. For instance, one suitable technique for forming the aromatic polyester may include charging precursor monomers and acetic anhydride into the reactor, heating the mixture to a temperature of from about 90° C. to about 150° C. to acetylize a hydroxyl group of the monomers (e.g., forming acetoxy), and then increasing the temperature to from about 280° C. to about 380° C. to carry out melt polycondensation. As the final polymerization temperatures are approached, volatile byproducts of the reaction (e.g., acetic acid) may also be removed so that the desired molecular weight may be readily achieved. The reaction mixture is generally subjected to agitation during polymerization to ensure good heat and mass transfer, and in turn, good material homogeneity. The rotational velocity of the agitator may vary during the course of the reaction, but typically ranges from about 10 to about 100 revolutions per minute ("rpm"), and in some embodiments, from about 20 to about 80 rpm. To build molecular weight in the melt, the polymerization reaction may also be conducted under vacuum, the application of which facilitates the removal of volatiles formed during the final stages of polycondensation. The vacuum may be created by the application of a suctional pressure, such as within the range of from about 5 to about 30 pounds per square inch ("psi"), and in some embodiments, from about 10 to about 20 psi.

Following melt polymerization, the molten polymer may be discharged from the reactor, typically through an extrusion orifice fitted with a die of desired configuration, cooled, and collected. Commonly, the melt is discharged through a perforated die to form strands that are taken up in a water bath, pelletized and dried. In some embodiments, the melt polymerized polymer may also be subjected to a subsequent solid-state polymerization method to further increase its molecular weight. Solid-state polymerization may be conducted in the presence of a gas (e.g., air, inert gas, etc.). Suitable inert gases may include, for instance, include nitrogen, helium, argon, neon, krypton, xenon, etc., as well as combinations thereof. The solid-state polymerization reactor vessel can be of virtually any design that will allow the polymer to be maintained at the desired solid-state polymerization temperature for the desired residence time. Examples of such vessels can be those that have a fixed bed, static bed, moving bed, fluidized bed, etc. The temperature at which solid-state polymerization is performed may vary, but is typically within a range of from about 250° C. to about 350° C. The polymerization time will of course vary based on the temperature and target molecular weight. In most cases, however, the solid-state polymerization time will be from about 2 to about 12 hours, and in some embodiments, from about 4 to about 10 hours.

When employed, the total amount of liquid crystalline polymers employed in the polymer composition may be from about 40 wt. % to about 99 wt. %, in some embodiments from about 50 wt. % to about 98 wt. %, and in some embodiments, from about 60 wt. % to about 95 wt. % of the entire polymer composition. In certain embodiments, all of the liquid crystalline polymers are "high naphthenic" polymers such as described above. In other embodiments, however, "low naphthenic" liquid crystalline polymers may also be employed in the composition in which the total amount of repeating units derived from naphthenic hydroxycarboxylic and/or dicarboxylic acids (e.g., NDA, HNA, or a combination of HNA and NDA) is less than 10 mol. %, in some embodiments about 8 mol. % or less, in some embodiments about 6 mol. % or less, and in some embodiments, from about 1 mol. % to about 5 mol. % of the polymer. In certain embodiments, it may be desired that the low naphthenic polymers are present in only a relatively low amount. For example, when employed, low naphthenic liquid crystalline polymers typically constitute from about 1 wt. % to about 50 wt. %, in some embodiments from about 2 wt. % to about 40 wt. %, and in some embodiments, from about 5 wt. % to about 30 wt. % of the total amount of liquid crystalline polymers in the composition, and from about 0.5 wt. % to about 45 wt. %, in some embodiments from about 2 wt. % to about 35 wt. %, and in some embodiments, from about 5 wt. % to about 25 wt. % of the entire composition. Conversely, high naphthenic liquid crystalline polymers typically constitute from about 50 wt. % to about 99 wt. %, in some embodiments from about 60 wt. % to about 98 wt. %, and in some embodiments, from about 70 wt. % to about 95 wt. % of the total amount of liquid crystalline polymers in the composition, and from about 55 wt. % to about 99.5 wt. %, in some embodiments from about 65 wt. % to about 98 wt. %, and in some embodiments, from about 75 wt. % to about 95 wt. % of the entire composition.

B. Other Additives

Aromatic polymer(s) may be employed in neat form within a polymer composition (i.e., 100 wt. % of the polymer composition), or a wide variety of other additives may optionally be included within the composition. When employed, such additives typically constitute from about 1 wt. % to about 60 wt. %, in some embodiments from about 2 wt. % to about 50 wt. %, and in some embodiments, from about 5 wt. % to about 40 wt. % of the polymer composition. In such embodiments, liquid crystalline polymers may likewise constitute from about 40 wt. % to about 99 wt. %, in some embodiments from about 50 wt. % to about 98 wt. %, and in some embodiments, from about 60 wt. % to about 95 wt. % of the polymer composition.

A wide variety of additional optional additives can also be included in the polymer composition, such as laser activatable additives, fibrous fillers, particulate fillers, hollow fillers, hydrophobic materials, lubricants, thermally conductive fillers, pigments, antioxidants, stabilizers, surfactants, waxes, flame retardants, anti-drip additives, nucleating agents (e.g., boron nitride), flow modifiers, coupling agents, antimicrobials, pigments or other colorants, impact modifiers, dielectric material, and other materials added to enhance properties and processability. Such optional materials may be employed in polymer composition in conventional amounts and according to conventional processing techniques.

i. Laser Activatable Additive

In certain other embodiments, for instance, the polymer composition may be "laser activatable" in the sense that it contains an additive that can be activated by a laser direct structuring ("LDS") process. In such a process, the additive is exposed to a laser that causes the release of metals. The laser thus draws the pattern of conductive elements onto the part and leaves behind a roughened surface containing embedded metal particles. These particles act as nuclei for the crystal growth during a subsequent plating process (e.g., copper plating, gold plating, nickel plating, silver plating, zinc plating, tin plating, etc.). The laser activatable additive generally includes spinel crystals, which may include two or more metal oxide cluster configurations within a definable crystal formation. For example, the overall crystal formation may have the following general formula:

$$AB_2O_4$$

wherein,

A is a metal cation having a valance of 2, such as cadmium, chromium, manganese, nickel, zinc, copper, cobalt, iron, magnesium, tin, titanium, etc., as well as combinations thereof; and B is a metal cation having a valance of 3, such as chromium, iron, aluminum, nickel, manganese, tin, etc., as well as combinations thereof.

Typically, A in the formula above provides the primary cation component of a first metal oxide cluster and B provides the primary cation component of a second metal oxide cluster. These oxide clusters may have the same or different structures. In one embodiment, for example, the first metal oxide cluster has a tetrahedral structure and the second metal oxide cluster has an octahedral cluster. Regardless, the clusters may together provide a singular identifiable crystal type structure having heightened susceptibility to electromagnetic radiation. Examples of suitable spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, $MgCr_2O_4$, etc. Copper chromium oxide ($CuCr_2O_4$) is particularly suitable for use in the present invention and is available from Shepherd Color Co. under the designation "Shepherd Black 1GM."

Laser activatable additives may constitute from about 0.1 wt. % to about 30 wt. %, in some embodiments from about 0.5 wt. % to about 20 wt. %, and in some embodiments, from about 1 wt. % to about 10 wt. % of the polymer composition.

ii. Fibrous Filler

In one embodiment, for example, a fibrous filler may be employed in the polymer composition to improve the thermal and mechanical properties of the polymer composition without having a significant impact on electrical performance. The fibrous filler typically includes fibers having a high degree of tensile strength relative to their mass. For example, the ultimate tensile strength of the fibers (determined in accordance with ASTM D2101) is typically from about 1,000 to about 15,000 Megapascals ("MPa"), in some embodiments from about 2,000 MPa to about 10,000 MPa, and in some embodiments from about 3,000 MPa to about 6,000 MPa. To help maintain the desired dielectric properties, such high strength fibers may be formed from materials that are generally insulative in nature, such as glass, ceramics or minerals (e.g., alumina or silica), aramids (e.g., Kevlar® marketed by E. I. duPont de Nemours, Wilmington, Del.), minerals, polyolefins, polyesters, etc.

The fibrous filler may include glass fibers, mineral fibers, or a mixture thereof. For instance, in one embodiment, the fibrous filler may include glass fibers. The glass fibers particularly suitable may include E-glass, A-glass, C-glass, D-glass, AR-glass, R-glass, S1-glass, S2-glass, etc. In another embodiment, the fibrous filler may include mineral fibers. The mineral fibers may include those derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); and so forth. Particularly suitable are inosilicates, such as wollastonite fibers available from Nyco Minerals under the trade designation NYGLOS® (e.g., NYGLOS® 4W or NYGLOS® 8).

Further, although the fibrous fillers may have a variety of different sizes, fibers having a certain aspect ratio can help improve the mechanical properties of the polymer composition. That is, fibrous fillers having an aspect ratio (average length divided by nominal diameter) of about 2 or more, in some embodiments about 4 or more, in some embodiments from about 5 to about 50, and in some embodiments from about 8 to about 40 may be particularly beneficial. Such fibrous fillers may, for instance, have a weight average length of about 10 micrometer or more, in some embodiments about 25 micrometers or more, in some embodiments from about 50 micrometers or more to about 800 micrometers or less, and in some embodiments from about 60 micrometers to about 500 micrometers. Also, such fibrous fillers may, for instance, have a volume average length of about 10 micrometer or more, in some embodiments about 25 micrometers or more, in some embodiments from about 50 micrometers or more to about 800 micrometers or less, and in some embodiments from about 60 micrometers to about 500 micrometers. The fibrous fillers may likewise have a nominal diameter of about 5 micrometers or more, in some embodiments about 6 micrometers or more, in some embodiments from about 8 micrometers to about 40 micrometers, and in some embodiments from about 9 micrometers to about 20 micrometers. The relative amount of the fibrous filler may also be selectively controlled to help achieve the desired mechanical and thermal properties without adversely impacting other properties of the polymer composition, such as its flowability and dielectric properties, etc. In this regard, the fibrous fillers may have a dielectric constant of about 6 or less, in some embodiments about 5.5 or less, in some embodiments from about 1.1 to about 5, and in some embodiments from about 2 to about 4.8 at a frequency of 1 GHz.

The fibrous filler may be in a modified or an unmodified form, e.g. provided with a sizing, or chemically treated, in order to improve adhesion to the plastic. In some examples, glass fibers may be provided with a sizing to protect the glass fiber, to smooth the fiber but also to improve the adhesion between the fiber and a matrix material. If present, a sizing may comprise silanes, film forming agents, lubricants, wetting agents, adhesive agents optionally antistatic agents and plasticizers, emulsifiers and optionally further additives. In one particular embodiment, the sizing may include a silane. Specific examples of silanes are aminosilanes, e.g. 3-trimethoxysilylpropylamine, N-(2-aminoethyl)-3-aminopropyltrimethoxy-silane, N-(3-trimethoxysilanyl-propyl)ethane-1,2-diamine, 3-(2-aminoethyl-amino)propyltrimethoxysilane, N-[3-(trimethoxysilyl)propyl]-1,2-ethane-diamine.

When employed, the fibrous filler may, for instance, constitute from about 1 wt. % to about 40 wt. %, in some embodiments from about 3 wt. % to about 30 wt. %, and in some embodiments, from about 5 wt. % to about 20 wt. % of the polymer composition.

iii. Hollow Filler

Although by no means required, the polymer composition may also include one or more hollow inorganic fillers to help achieve the desired dielectric constant. For instance, such fillers may have a dielectric constant of about 3.0 or less, in some embodiments about 2.5 or less, in some embodiments from about 1.1 to about 2.3, and in some embodiments from about 1.2 to about 2.0 at 100 MHz. The hollow inorganic fillers typically have an interior hollow space or cavity and may be synthesized using techniques known in the art. The hollow inorganic fillers may be made from conventional materials. For instance, the hollow inorganic fillers may include alumina, silica, zirconia, magnesia, glass, fly ash, borate, phosphate, ceramic, and the like. In one embodiment, the hollow inorganic fillers may include hollow glass fillers, hollow ceramic fillers, and mixtures thereof. In one embodiment, the hollow inorganic fillers include hollow glass fillers. The hollow glass fillers may be made from a soda lime borosilicate glass, a soda lime glass, a borosilicate glass, a sodium borosilicate glass, a sodium silicate glass, or an aluminosilicate glass. In this regard, in one embodiment, the composition of the glass, while not limited, may be at least about 65% by weight of $SiO_2$, 3-15% by weight of $Na_2O$, 8-15% by weight of CaO, 0.1-5% by weight of MgO, 0.01-3% by weight of $Al_2O_3$, 0.01-1% by weight of $K_2O$, and optionally other oxides (e.g., $Li_2O$, $Fe_2O_3$, $TiO_2$, $B_2O_3$). In another embodiment, the composition may be about 50-58% by weight of $SiO_2$, 25-30% by weight of $Al_2O_3$, 6-10% by weight of CaO, 1-4% by weight of $Na_2O/K_2O$, and 1-5% by weight of other oxides. Also, in one embodiment, the hollow glass fillers may include more alkaline earth metal oxides than alkali metal oxides. For example, the weight ratio of the alkaline earth metal oxides to the alkali metal oxides may be more than 1, in some embodiments about 1.1 or more, in some embodiments about 1.2 to about 4, and in some embodiments from about 1.5 to about 3. Regardless of the above, it should be understood that the glass composition may vary depending on the type of glass utilized and still provide the benefits as desired by the present invention.

The hollow inorganic fillers may have at least one dimension having an average value that is about 1 micrometers or more, in some embodiments about 5 micrometers or more, in some embodiments about 8 micrometers or more, in some embodiments from about 1 micrometer to about 150 micrometers, in some embodiments from about 10 micrometers to about 150 micrometers, and in some embodiments from about 12 micrometers to about 50 micrometers. In one embodiment, such average value may refer to a d50 value. Furthermore, the hollow inorganic fillers may have a Dio of about 3 micrometers or more, in some embodiments about 4 micrometers or more, in some embodiments from about 5 micrometers to about 20 micrometers, and in some embodiments from about 6 micrometers to about 15 micrometers. The hollow inorganic fillers may have a D90 of about 10 micrometers or more, in some embodiments about 15 micrometers or more, in some embodiments from about 20 micrometers to about 150 micrometers, and in some embodiments from about 22 micrometers to about 50 micrometers. In this regard, the hollow inorganic fillers may be present in a size distribution, which may be a Gaussian, normal, or non-normal size distribution. In one embodiment, the hollow inorganic fillers may have a Gaussian size distribution. In another embodiment, the hollow inorganic fillers may have a normal size distribution. In a further embodiment, the hollow inorganic fillers may have a non-normal size distribution. Examples of non-normal size distributions may include unimodal and multi-modal (e.g., bimodal) size distributions. When referring to dimensions above, such dimension may be any dimension. In one embodiment, however, such dimension refers to a diameter. For example, such value for the dimension refers to an average diameter of spheres. The dimension, such as the average diameter, may be determined in accordance to 3M QCM 193.0. In this regard, in one embodiment, the hollow inorganic fillers may be referring to hollow spheres such as hollow glass spheres. For instance, the hollow inorganic fillers may have an average aspect ratio of approximately 1. In general, the average aspect ratio may be about 0.8 or more, in some embodiments about 0.85 or more, in some embodiments from about 0.9 to about 1.3, and in some embodiments from about 0.95 to about 1.05.

In addition, the hollow inorganic fillers may have relatively thin walls to help with the dielectric properties of the polymer composition as well as the reduction in weight. The thickness of the wall may be about 50% or less, in some embodiments about 40% or less, in some embodiments from about 1% to about 30%, and in some embodiments from about 2% to about 25% the average dimension, such as the average diameter, of the hollow inorganic fillers. In addition, the hollow inorganic fillers may have a certain true density that can allow for easy handling and provide a polymer composition having a reduction in weight. In general, the true density refers to the quotient obtained by dividing the mass of a sample of the hollow fillers by the true volume of that mass of hollow fillers wherein the true volume is referred to as the aggregate total volume of the hollow fillers. In this regard, the true density of the hollow inorganic fillers may be about 0.1 g/cm³ or more, in some embodiments about 0.2 g/cm³ or more, in some embodiments from about 0.3 g/cm³ or more to about 1.2 g/cm³, and in some embodiments from about 0.4 g/cm³ or more to about 0.9 g/cm³. The true density may be determined in accordance to 3M QCM 14.24.1.

Even though the fillers are hollow, they may have a mechanical strength that allows for maintaining the integrity of the structure of the fillers resulting in a lower likelihood of the fillers being broken during processing and/or use. In this regard, the isotactic crush resistance (i.e., wherein at least 80 vol. %, such as at least 90 vol. % of the hollow fillers survive) of the hollow inorganic fillers may be about 20 MPa or more, in some embodiments about 100 MPa or more, in some embodiments from about 150 MPa to about 500 MPa, and in some embodiments from about 200 MPa to about 350 MPa. The isotactic crush resistance may be determined in accordance to 3M QCM 14.1.8.

The alkalinity of the hollow inorganic fillers may be about 1.0 meq/g or less, in some embodiments about 0.9 meq/g or less, in some embodiments from about 0.1 meq/g to about 0.8 meq/g, and in some embodiments from about 0.2 meq/g to about 0.7 meq/g. The alkalinity may be determined in accordance with 3M QCM 55.19. In order to provide a relatively low alkalinity, the hollow inorganic fillers may be treated with a suitable acid, such as a phosphoric acid. In addition, the hollow inorganic fillers may also include a surface treatment to assist with providing a better compatibility with the polymer and/or other components within the polymer composition. As an example, the surface treatment may be a silanization. In particular, the surface treatment agents may include, but are not limited to, aminosilanes, epoxysilanes, etc.

When employed, the hollow inorganic fillers may, for instance, constitute about 1 wt. % or more, in some embodiments about 4 wt. % or more, in some embodiments from about 5 wt. % to about 40 wt. %, and in some embodiments from about 10 wt. % to about 30 wt. % of the polymer composition.

iv. Particulate Filler

If desired, a particulate filler may be employed for improving certain properties of the polymer composition. The particulate filler may be employed in the polymer composition in an amount of from about 5 to about 60 parts, in some embodiments from about 10 to about 50 parts, and in some embodiments, from about 15 to about 40 parts by weight per 100 parts of the aromatic polymer(s) employed in the polymer composition. For instance, the particulate filler may constitute from about 5 wt. % to about 50 wt. %, in some embodiments from about 10 wt. % to about 40 wt. %, and in some embodiments, from about 15 wt. % to about 30 wt. % of the polymer composition.

In certain embodiments, particles may be employed that have a certain hardness value to help improve the surface properties of the composition. For instance, the hardness values may be about 2 or more, in some embodiments about 2.5 or more, in some embodiments from about 3 to about 11, in some embodiments from about 3.5 to about 11, and in some embodiments, from about 4.5 to about 6.5 based on the Mohs hardness scale. Examples of such particles may include, for instance, silica (Mohs hardness of 7), mica (e.g., Mohs hardness of about 3); carbonates, such as calcium carbonate (CaCO3, Mohs hardness of 3.0) or a copper carbonate hydroxide ($Cu_2CO_3(OH)_2$, Mohs hardness of 4.0); fluorides, such as calcium fluoride ($CaFl_2$, Mohs hardness of 4.0); phosphates, such as calcium pyrophosphate (($Ca_2P_2O_7$, Mohs hardness of 5.0), anhydrous dicalcium phosphate ($CaHPO_4$, Mohs hardness of 3.5), or hydrated aluminum phosphate ($AlPO_4 \cdot 2H_2O$, Mohs hardness of 4.5); borates, such as calcium borosilicate hydroxide ($Ca_2B_5SiO_9$ $(OH)_5$, Mohs hardness of 3.5); alumina ($AlO_2$, Mohs hardness of 10.0); sulfates, such as calcium sulfate ($CaSO_4$, Mohs hardness of 3.5) or barium sulfate ($BaSO_4$, Mohs hardness of from 3 to 3.5); and so forth, as well as combinations thereof.

The shape of the particles may vary as desired. For instance, flake-shaped particles may be employed in certain embodiments that have a relatively high aspect ratio (e.g., average diameter divided by average thickness), such as about 10:1 or more, in some embodiments about 20:1 or more, and in some embodiments, from about 40:1 to about 200:1. The average diameter of the particles may, for example, range from about 5 micrometers to about 200 micrometers, in some embodiments from about 30 micrometers to about 150 micrometers, and in some embodiments, from about 50 micrometers to about 120 micrometers, such as determined using laser diffraction techniques in accordance with ISO 13320:2009 (e.g., with a Horiba LA-960 particle size distribution analyzer). Suitable flaked-shaped particles may be formed from a natural and/or synthetic silicate mineral, such as mica, halloysite, kaolinite, illite, montmorillonite, vermiculite, palygorskite, pyrophyllite, calcium silicate, aluminum silicate, wollastonite, etc. Mica, for instance, is particularly suitable. Any form of mica may generally be employed, including, for instance, muscovite ($KAl_2(AlSi_3)O_{10}(OH)_2$), biotite ($K(Mg,Fe)_3(AlSi_3)O_{10}$ $(OH)_2$), phlogopite ($KMg_3(AlSi_3)O_{10}(OH)_2$), lepidolite ($K(Li,Al)_{2-3}(AlSi_3)O_{10}(OH)_2$), glauconite ($K,Na)(Al,Mg,$ $Fe)_2(Si,Al)_4O_{10}(OH)_2$), etc. Granular particles may also be employed. Typically, such particles have an average diameter of from about 0.1 to about 10 micrometers, in some embodiments from about 0.2 to about 4 micrometers, and in some embodiments, from about 0.5 to about 2 micrometers, such as determined using laser diffraction techniques in accordance with ISO 13320:2009 (e.g., with a Horiba LA-960 particle size distribution analyzer). Particularly suitable granular fillers may include, for instance, talc, barium sulfate, calcium sulfate, calcium carbonate, etc.

The particulate filler may be formed primarily or entirely from one type of particle, such as flake-shaped particles (e.g., mica) or granular particles (e.g., barium sulfate). That is, such flaked-shaped or granular particles may constitute about 50 wt. % or more, and in some embodiments, about 75 wt. % or more (e.g., 100 wt. %) of the particulate filler. Of course, in other embodiments, flake-shaped and granular particles may also be employed in combination. In such embodiments, for example, flake-shaped particles may constitute from about 0.5 wt. % to about 20 wt. %, and in some embodiments, from about 1 wt. % to about 10 wt. % of the particulate filler, while the granular particles constitute from about 80 wt. % to about 99.5 wt. %, and in some embodiments, from about 90 wt. % to about 99 wt. % of the particulate filler.

If desired, the particles may also be coated with a fluorinated additive to help improve the processing of the composition, such as by providing better mold filling, internal lubrication, mold release, etc. The fluorinated additive may include a fluoropolymer, which contains a hydrocarbon backbone polymer in which some or all of the hydrogen atoms are substituted with fluorine atoms. The backbone polymer may polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene, vinylidene fluoride, hexafluoropropylene, chlorotrifluoroethylene, perfluoroethylvinyl ether, perfluoromethylvinyl ether, perfluoropropylvinyl ether, etc., as well as mixtures thereof. Specific examples of suitable fluoropolymers include polytetrafluoroethylene, perfluoroalkylvinyl ether, poly(tetrafluoroethylene-co-perfluoroalkyvinylether), fluorinated ethylene-propylene copolymer, ethylene-tetrafluoroethylene copolymer, polyvinylidene fluoride, polychlorotrifluoroethylene, etc., as well as mixtures thereof.

v. Hydrophobic Material

A hydrophobic material may also be employed in the polymer composition. Without intending to be limited by theory, it is believed that the hydrophobic material can help reduce the tendency of the polymer composition to absorb water, which can help stabilize the dielectric constant and dissipation factor at high frequency ranges. When employed, the weight ratio of liquid crystalline polymer(s) to hydrophobic material(s) is typically from about 1 to about 20, in some embodiments from about 2 to about 15, and in some embodiments, from about 3 to about 10. For example, the hydrophobic material may constitute from about 1 wt. % to about 60 wt. %, in some embodiments from about 2 wt. % to about 50 wt. %, and in some embodiments, from about 5 wt. % to about 40 wt. % of the entire polymer composition. Particularly suitable hydrophobic materials are low surface energy elastomers, such as fluoropolymers, silicone polymers, etc. Fluoropolymers, for instance, may contains a hydrocarbon backbone polymer in which some or all of the hydrogen atoms are substituted with fluorine atoms. The backbone polymer may polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene ("TFE"), vinylidene fluoride ("VF2"), hexafluoropropylene ("HFP"), chlorotrifluoroethylene ("CTFE"), perfluoroethylvinyl ether ("PEVE"), perfluoromethylvinyl ether ("PMVE"), perfluoropropylvinyl ether ("PPVE"), etc., as well as mixtures thereof. Specific examples of suitable fluoropolymers include polytetrafluoroethylene ("PTFE"), perfluoroalkylvinyl ether ("PVE"), poly(tetrafluoroethylene-co-perfluoroalkyvinyl ether) ("PFA"), fluorinated ethylene-propylene copolymer ("FEP"), ethylene-tetrafluoroethylene copolymer ("ETFE"), polyvinylidene fluoride ("PVDF"), polychlorotrifluoroethylene ("PCTFE"), and TFE copolymers with VF2 and/or HFP, etc., as well as mixtures thereof.

II. Formation

The components used to form the polymer composition may be combined together using any of a variety of different techniques as is known in the art. In one particular embodiment, for example, the aromatic polymer and other optional additives are melt processed as a mixture within an extruder to form the polymer composition. The mixture may be melt-kneaded in a single-screw or multi-screw extruder at a temperature of from about 200° C. to about 450° C. In one embodiment, the mixture may be melt processed in an extruder that includes multiple temperature zones. The temperature of individual zones are typically set within about −60° C. to about 25° C. relative to the melting temperature of the polymer. By way of example, the mixture may be melt processed using a twin screw extruder such as a Leistritz 18-mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. For example, the polymer may be applied at the feed throat, and certain additives (e.g., laser activatable additive and/or other additives) may be supplied at the same or different temperature zone located downstream therefrom. Regardless, the resulting mixture can be melted and mixed then extruded through a die. The extruded polymer composition can then be quenched in a water bath to solidify and granulated in a pelletizer followed by drying.

In addition to being mixed during melt processing, it is also possible to incorporate additives (e.g., hydrophobic material) into the polymer matrix during formation of the aromatic polymer. For example, the aromatic precursor monomers used to form the polymer may be reacted in the presence of the additive (e.g., within the polymerization apparatus). In this manner, the additive can become physically incorporated into the resulting polymer matrix. Although it may be introduced at any time, it is typically desired to apply the additive before melt polymerization has been initiated, and typically in conjunction with the other aromatic precursor monomers for the polymer. The relative amount of the additive added to the reaction vary, but is typically from about 0.1 wt. % to about 35 wt. %, in some embodiments from about 0.5 wt. % to about 30 wt. %, and in some embodiments, from about 1 wt. % to about 25 wt. % of the reaction mixture.

Regardless of the manner in which the components are incorporated into the composition, the resulting melt viscosity is generally low enough that it can readily flow into the cavity of a mold to form a small-sized electrical component. For example, in one particular embodiment, the polymer composition may have a melt viscosity of about 500 Pa-s or less, in some embodiments about 250 Pa-s or less, in some embodiments from about 5 Pa-s to about 150 Pa-s, in some embodiments from about 5 Pa-s to about 100 Pa-s, in some embodiments from about 10 Pa-s to about 100 Pa-s, in some embodiments from about 15 to about 90 Pa-s, as determined at a shear rate of 1,000 seconds-1.

II. RF Filter

As noted above, the RF filter of the present invention typically includes one or more resonator elements (e.g., piezoelectric material, dielectric material, etc.), which can produce resonant behavior over a narrow frequency band in the desired 5G frequency. The particular configuration and operation of the filter may vary as is known to those skilled in the art. For example, the RF filter may be an acoustic filter, such as a surface acoustic wave (SAW) filter, bulk acoustic wave filter (BAW), film bulk acoustic resonator (FBAR or TFBAR), etc. Such acoustic filters generally employ a piezoelectric material, such as quartz, lithium tantalite, lithium niobate, lanthanum gallium silicate, aluminum nitride, and so forth. In a SAW filter, for example, an electrical input signal is converted into an acoustic wave by interleaved metal interdigital transducers (IDTs) created on a piezoelectric substrate. In a BAW filter, the piezoelectric substrate is sandwiched between two electrodes and acoustically isolated from the surrounding medium. In this manner, an electrical input signal causes acoustic waves to be excited and reflect and propagate vertically to form a standing acoustic wave. The thin outer layers acts as an acoustic reflector to keep the acoustic waves from escaping into the substrate. In a FBAR filter, a cavity is etched below the active area so that the air/crystal interface on both faces of the resonator traps the acoustic waves.

Apart from acoustic filters, other types of RF filters may also be used. For example, a cavity filter may be employed in which resonator elements (e.g., dielectric materials) are disposed within a plurality of cavities formed in a housing structure. One of the most frequently used resonators in a cavity filter is the coaxial resonator, which is structured to have a cylindrical form with a hole or recess formed therein. Suitable dielectric materials may include, for instance, titanate-based, niobate-based, and/or or tantalate (BZT)-based dielectric materials, such as barium titanate, strontium titanate, barium strontium titanate, etc.

Figure 6:
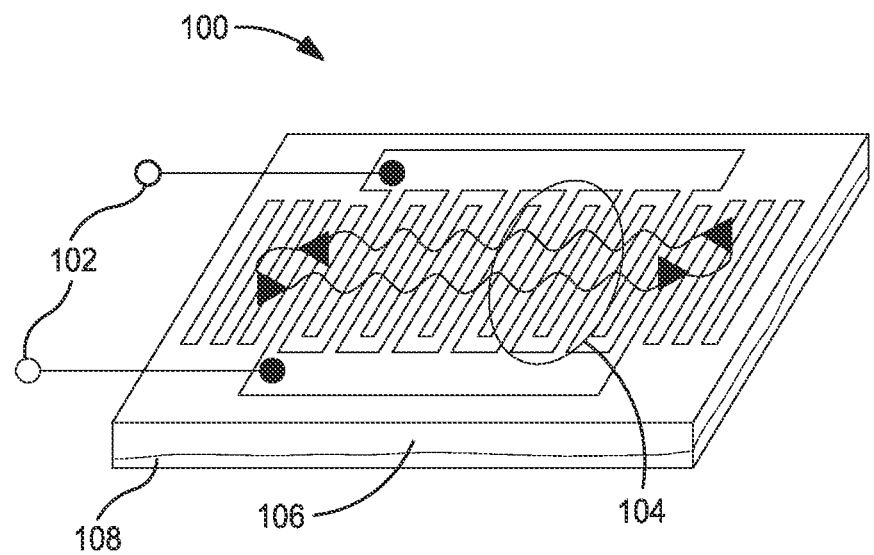
FIG. 6 is a schematic view of one embodiment an RF SAW filter that may be employed in the present invention.
Figure 7:
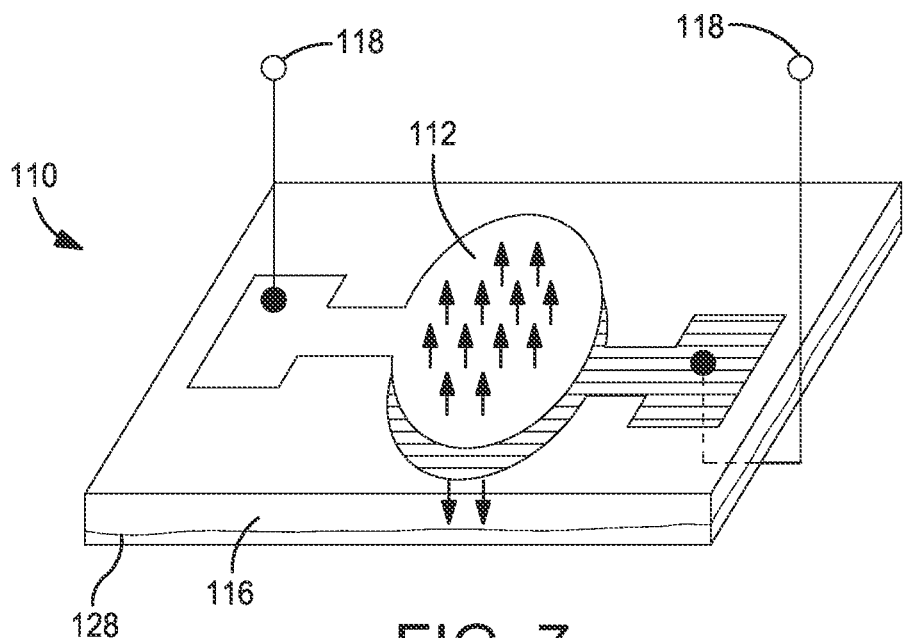
FIG. 7 is a schematic view of one embodiment of an RF BAW filter for use in the present invention.

Regardless of its particular configuration, the RF filter may employ the polymer composition of the present invention, which has a low dielectric constant and dissipation factor to provide good performance at 5G frequencies, in a wide variety of ways. For instance, in an acoustic filter, the polymer composition may be used to form a substrate that supports the resonator element (e.g., piezoelectric material). In such embodiments, the resonator element may be supported by the substrate by directly disposing the resonator element onto the substrate. Alternatively, various other layers (e.g., reflectors, adhesives, etc.) may be positioned between the substrate and the resonator element. Referring to FIG. 6, for example, one embodiment of a SAW filter 100 is shown in which an electrical input signal is provided via electrical ports 102 (i.e., I/O pads), with the electrical input signal being converted to an acoustic wave by interleaved metal interdigital transducers 104 created on a piezoelectric substrate 106. If desired, a substrate 108 may also be provided that is formed from the polymer composition of the present invention and that supports the piezoelectric substrate 104. Similarly, referring to FIG. 7, one embodiment of a BAW filter 110 is shown in which a piezoelectric substrate 116 is positioned between upper metal layers 112 and lower metal layers (now shown). In this manner, acoustic waves are excited in response to an electrical input signal provided thereto via electrical ports 118. If desired, a substrate 128 may also be provided that is formed from the polymer composition of the present invention and that supports the piezoelectric substrate 116, either directly or indirectly via the metal layers. When the polymer composition is employed in a substrate, such as shown in FIG. 6 or FIG. 7, it may optionally include a laser activatable additive such that conductive elements (e.g., transducers, metal layers, etc.) may then be formed on the substrate using a laser direct structuring process ("LDS"). Activation with a laser causes a physio-chemical reaction in which the spinel crystals are cracked open to release metal atoms. These metal atoms can act as a nuclei for metallization (e.g., reductive copper coating). The laser also creates a microscopically irregular surface and ablates the polymer matrix, creating numerous microscopic pits and undercuts in which the metal can be anchored during metallization.

Figure 8:
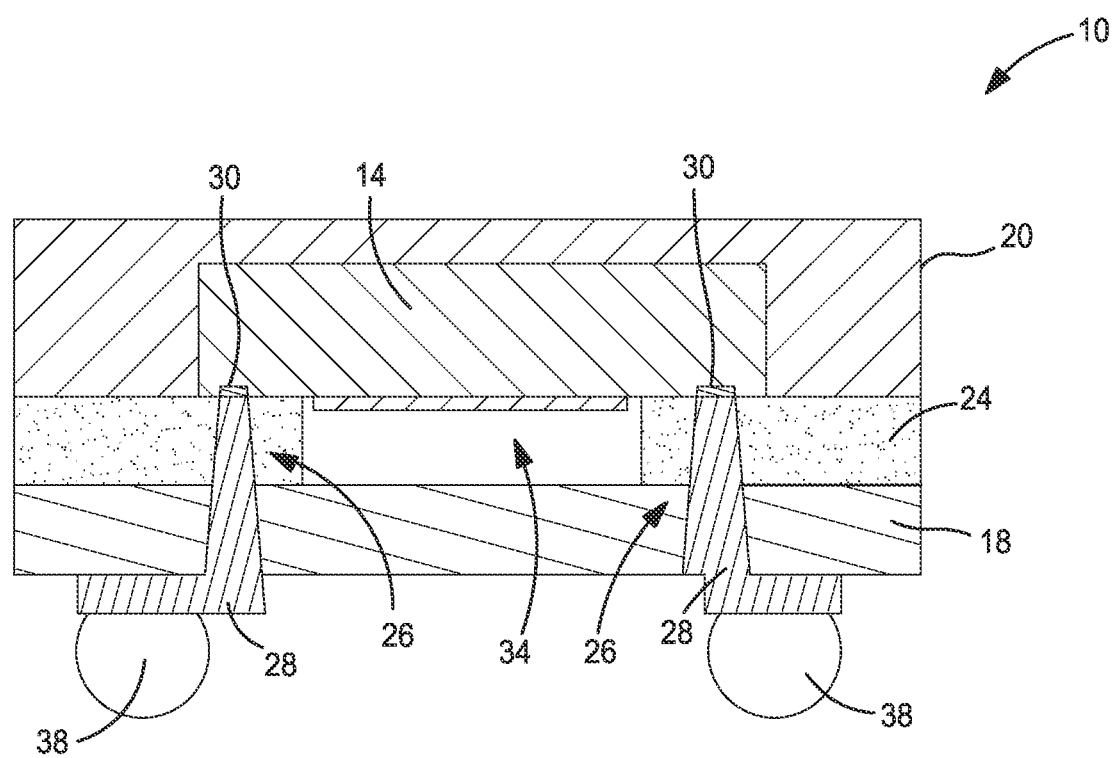
FIG. 8 is a schematic view of one embodiment of another embodiment of an RF SAW filter that may be employed in the present invention.

As noted above, the RF filter may also include a housing that covers one or more elements of the filter (e.g., resonator element, support substrate, etc.) to form a discrete package. In such embodiments, the housing may be made from the polymer composition of the present invention. Referring to FIG. 8, for example, one example of an RF filter package 10 is shown that contains a resonator element 14 (e.g., piezoelectric material) supported by a substrate 18 as described above. In this embodiment, an adhesive 24 is used to attach the substrate 18 to the resonator element 14, but this is by no means required. If desired, the substrate 18 may be formed from the polymer composition of the present invention. A housing 20 is also provided that overlies the resonator element 14 and the substrate 18 to provide protection and structural integrity. If desired, the housing 20 may be formed from the polymer composition of the present invention. Optionally, vias 26 are formed through the substrate 18 that extend to the resonator element 14. Metal interconnects 28 are subsequently formed/patterned in the package 10 to provide electrical connections therein, with the interconnects 28 being formed in the vias 26 down to I/O pads 30 on the front surface of the resonator element 14 and out onto a surface of dielectric layer 18. The polymer composition used in the substrate 18 and/or housing 20 may optionally include a laser activatable additive such that the interconnects 28 and/or pads 30 can be formed using a laser direct structuring process ("LDS"). If desired, an air cavity 34 may also be provided in adhesive layer 24 to allow for proper vibration and associated acoustic wave generation by the resonator element 14. Input/output (I/O) connections 38 (e.g., solder balls) may also be provided on the metal interconnects 28 for connection of the package 10 to an external device, such as a printed circuit board (not shown).

Figure 9:
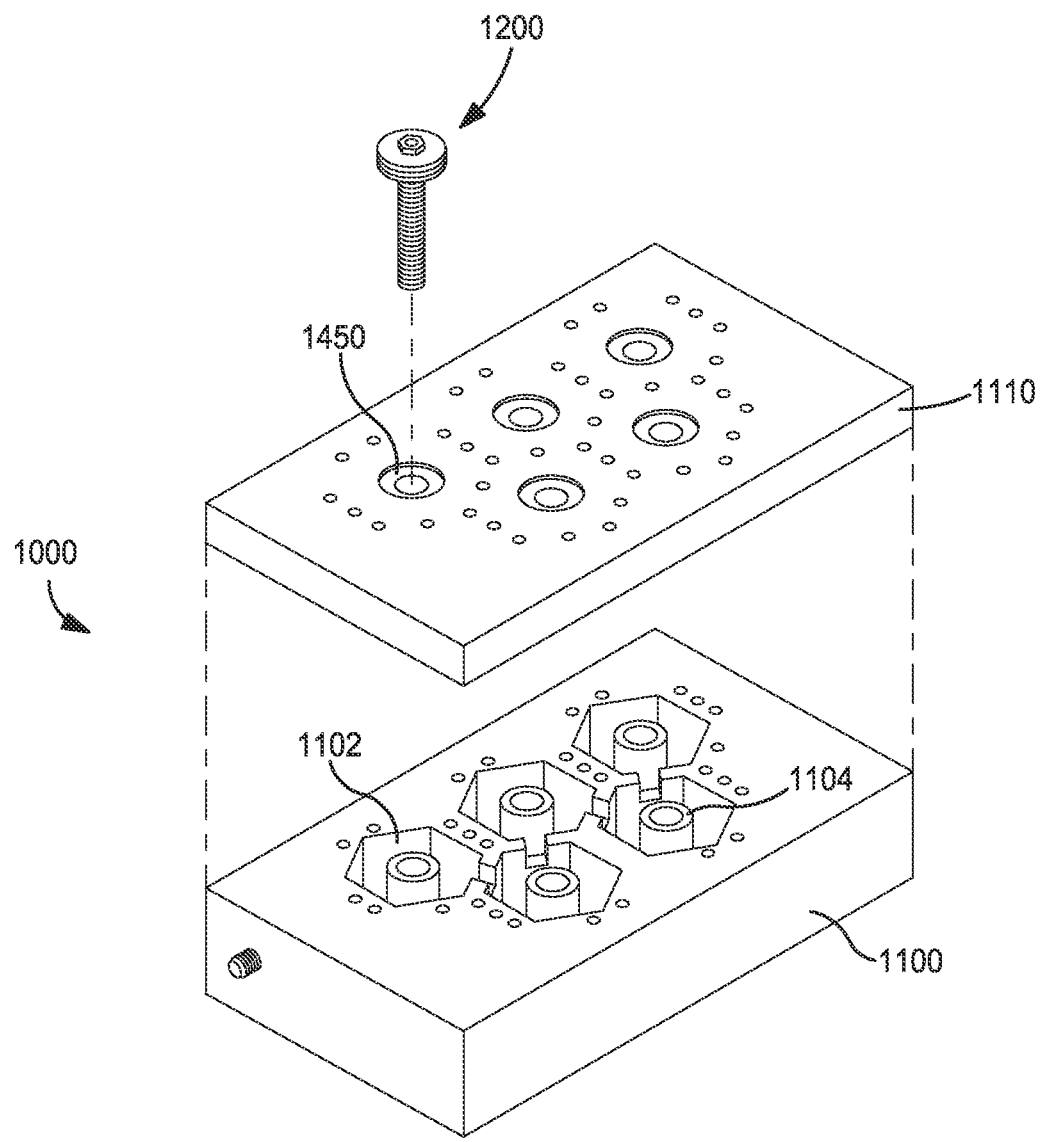
FIG. 9 is a schematic view of one embodiment of an RF cavity filter that may be employed in the present invention.

In the embodiments discussed above and shown in FIGS. 6-8, the polymer composition of the present invention is employed in an acoustic RF filter. However, as noted above, various other RF filter configurations may also employ the polymer composition. In one embodiment, for example, the RF filter may be a cavity filter. Referring to FIG. 9, for instance, one embodiment of a cavity filter 1000 is shown that contains a housing 1000 and cover 1110, one or both of which may be formed from the polymer composition of the present invention. As shown, multiple cavities 1102 may be formed within the housing 1100 within which resonator elements 1104 may be positioned. Suitable resonator elements 1104 for this purpose may include, for example, a dielectric material. Although not required, the resonator elements 1104 may have a cylindrical shape, and a recess or hole can be formed in at least a portion of the cylinder. Of course, a resonator shaped as a disc can also be used as needed, and a resonator having any of a variety of known shapes can be applied to an embodiment of the invention. The resonator elements 1104 can be joined to a bottom portion of the cavity by using a bolt, etc. If desired, the housing 1100 may contain a metal plating (e.g., silver or copper), which can be formed by laser direction structuring when the polymer composition contains a laser metal activatable additive. The housing 1100 and cover 1110 of the filter may have a ground potential, and to help to obtain the desired electrical properties and provide good fastening, a pressing member 2000 may be employed at an insertion area 1450 to provide the pressure needed for the tight pressing. The positions of insertion areas 1450 formed in the cover 1110 may correspond to the positions of the resonators 1104.

III. Applications

The RF filter may be employed in a wide variety of different applications. In certain embodiments, the RF filter is specifically configured for use in a 5G antenna system. More particularly, the RF filter is configured to receive and/or transmit a signal to or from the antenna system and filter out certain frequencies outside the 5G frequency band that would otherwise interfere with the desired signal to other electrical components, such as a low-noise amplifier (LNA), oscillator, or transceiver. As used herein, "5G" generally refers to high speed data communication over radio frequency signals. 5G networks and systems are capable of communicating data at much faster rates than previous generations of data communication standards (e.g., "4G, "LTE"). Various standards and specifications have been released quantifying the requirements of 5G communications. As one example, the International Telecommunications Union (ITU) released the International Mobile Telecommunications-2020 ("IMT-2020") standard in 2015. The IMT-2020 standard specifies various data transmission criteria (e.g., downlink and uplink data rate, latency, etc.) for 5G. The IMT-2020 Standard defines uplink and downlink peak data rates as the minimum data rates for uploading and downloading data that a 5G system must support. The IMT-2020 standard sets the downlink peak data rate requirement as 20 Gbit/s and the uplink peak data rate as 10 Gbit/s. As another example, $3^{rd}$ Generation Partnership Project (3GPP) recently released new standards for 5G, referred to as "5G NR." 3GPP published "Release 15" in 2018 defining "Phase 1" for standardization of 5G NR. 3GPP defines 5G frequency bands generally as "Frequency Range 1" (FR1) including sub-6 GHz frequencies and "Frequency Range 2" (FR2) as frequency bands ranging from 20-60 GHz. However, as used herein "5G frequencies" can refer to systems utilizing frequencies greater than 60 GHz, for example ranging up to 80 GHz, up to 150 GHz, and up to 300 GHz. As used herein, "5G frequencies" can refer to frequencies that are about 2.5 GHz or higher, in some embodiments about 3.0 GHz or higher, in some embodiments from about 3 GHz to about 300 GHz, or higher, in some embodiments from about 4 GHz to about 80 GHz, in some embodiments from about 5 GHz to about 80 GHz, in some embodiments from about 20 GHz to about 80 GHz, and in some embodiments from about 28 GHz to about 60 GHz.

5G antenna systems generally employ high frequency antennas and antenna arrays for use in base stations, repeaters (e.g., "femtocells"), relay stations, terminals, user devices, and/or other suitable components of 5G systems. The antenna elements/arrays and systems can satisfy or qualify as "5G" under standards released by 3GPP, such as Release 15 (2018), and/or the IMT-2020 Standard. To achieve such high speed data communication at high frequencies, antenna elements and arrays generally employ small feature sizes/spacing (e.g., fine pitch technology) and/or advanced materials that can improve antenna performance. For example, the feature size (spacing between antenna elements, width of antenna elements) etc. is generally dependent on the wavelength ("λ") of the desired transmission and/or reception radio frequency propagating through the circuit board on which the antenna element is formed (e.g., nλ/4 where n is an integer). Further, beamforming and/or beam steering can be employed to facilitate receiving and transmitting across multiple frequency ranges or channels (e.g., multiple-in-multiple-out (MIMO), massive MIMO). The high frequency 5G antenna elements can have a variety of configurations. For example, the 5G antenna elements can be or include co-planar waveguide elements, patch arrays (e.g., mesh-grid patch arrays), other suitable 5G antenna configurations. The antenna elements can be configured to provide MIMO, massive MIMO functionality, beam steering, etc. As used herein "massive" MIMO functionality generally refers to providing a large number transmission and receiving channels with an antenna array, for example 8 transmission (Tx) and 8 receive (Rx) channels (abbreviated as 8×8). Massive MIMO functionality may be provided with 8×8, 12×12, 16×16, 32×32, 64×64, or greater.

The antenna elements may be fabricated using a variety of manufacturing techniques. As one example, the antenna elements and/or associated elements (e.g., ground elements, feed lines, etc.) can employ fine pitch technology. Fine pitch technology generally refers to small or fine spacing between their components or leads. For example, feature dimensions and/or spacing between antenna elements (or between an antenna element and a ground plane) can be about 1,500 micrometers or less, in some embodiments 1,250 micrometers or less, in some embodiments 750 micrometers or less (e.g., center-to-center spacing of 1.5 mm or less), 650 micrometers or less, in some embodiments 550 micrometers or less, in some embodiments 450 micrometers or less, in some embodiments 350 micrometers or less, in some embodiments 250 micrometers or less, in some embodiments 150 micrometers or less, in some embodiments 100 micrometers or less, and in some embodiments 50 micrometers or less. However, it should be understood that feature sizes and/or spacings that are smaller and/or larger may also be employed. As a result of such small feature dimensions, antenna configurations and/or arrays can be achieved with a large number of antenna elements in a small footprint. For example, an antenna array can have an average antenna element concentration of greater than 1,000 antenna elements per square centimeter, in some embodiments greater than 2,000 antenna elements per square centimeter, in some embodiments greater than 3,000 antenna elements per square centimeter, in some embodiments greater than 4,000 antenna elements per square centimeter, in some embodiments greater than 6,000 antenna elements per square centimeter, and in some embodiments greater than about 8,000 antenna elements per square centimeter. Such compact arrangement of antenna elements can provide a greater number of channels for MIMO functionality per unit area of the antenna area. For example, the number of channels can correspond with (e.g., be equal to or proportional with) the number of antenna elements.

Referring to FIG. 1, for example, a 5G antenna system 100 can include a base station 102, one or more relay stations 104, one or more user computing devices 106, one or more Wi-Fi repeaters 108 (e.g., "femtocells"), and/or other suitable antenna components for the 5G antenna system 100. The relay stations 104 can be configured to facilitate communication with the base station 102 by the user computing devices 106 and/or other relay stations 104 by relaying or "repeating" signals between the base station 102 and the user computing devices 106 and/or relay stations 104. The base station 102 can include a MIMO antenna array 110 configured to receive and/or transmit radio frequency signals 112 with the relay station(s) 104, Wi-Fi repeaters 108, and/or directly with the user computing device(s) 106. The user computing device 306 is not necessarily limited by the present invention and include devices such as 5G smartphones.

The MIMO antenna array 110 can employ beam steering to focus or direct radio frequency signals 112 with respect to the relay stations 104. For example, the MIMO antenna array 110 can be configured to adjust an elevation angle 114 with respect to an X-Y plane and/or a heading angle 116 defined in the Z-Y plane and with respect to the Z direction. Similarly, one or more of the relay stations 104, user computing devices 106, Wi-Fi repeaters 108 can employ beam steering to improve reception and/or transmission ability with respect to MIMO antenna array 110 by directionally tuning sensitivity and/or power transmission of the device 104, 106, 108 with respect to the MIMO antenna array 110 of the base station 102 (e.g., by adjusting one or both of a relative elevation angle and/or relative azimuth angle of the respective devices).

Figure 2A:
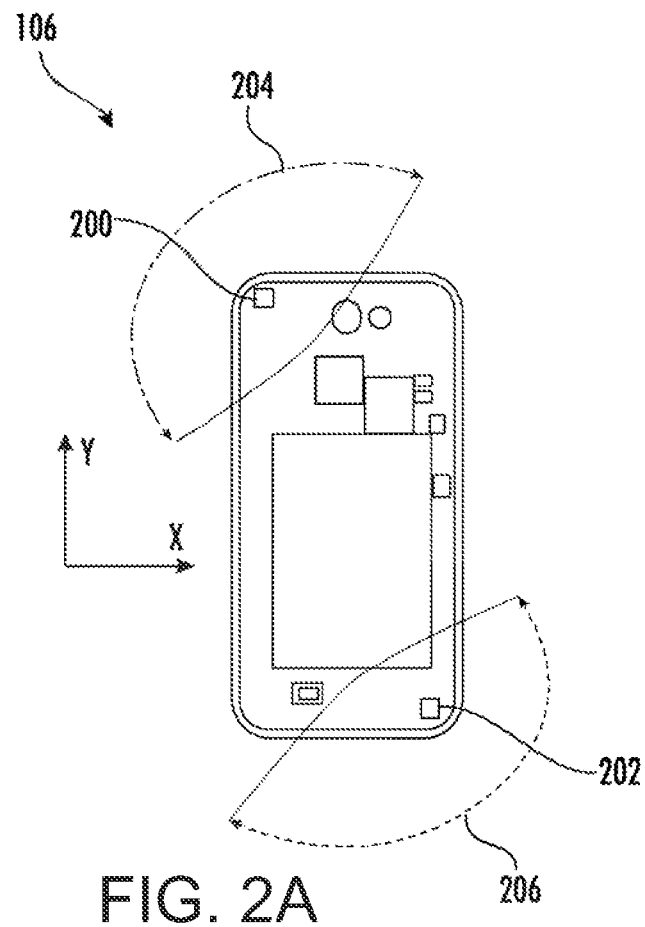
FIG. 2A illustrates a top-down view of an example user computing device including 5G antennas.
Figure 2B:
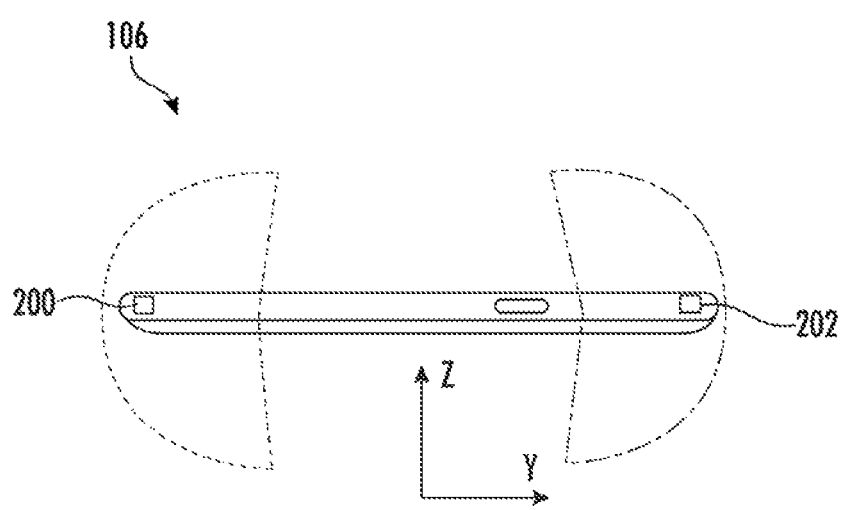
FIG. 2B illustrates a side elevation view of the example user computing device of FIG. 2A.

FIGS. 2A-2B likewise illustrate a top-down and side elevation view, respectively, of an example user computing device 106. The user computing device 106 may include one or more antenna elements 200, 202 (e.g., arranged as respective antenna arrays). Referring to FIG. 2A, the antenna elements 200, 202 can be configured to perform beam steering in the X-Y plane (as illustrated by arrows 204, 206 and corresponding with a relative azimuth angle). Referring to FIG. 2B, the antenna elements 200, 202 can be configured to perform beam steering in the Z-Y plane (as illustrated by arrows 204, 206).

Figure 3:
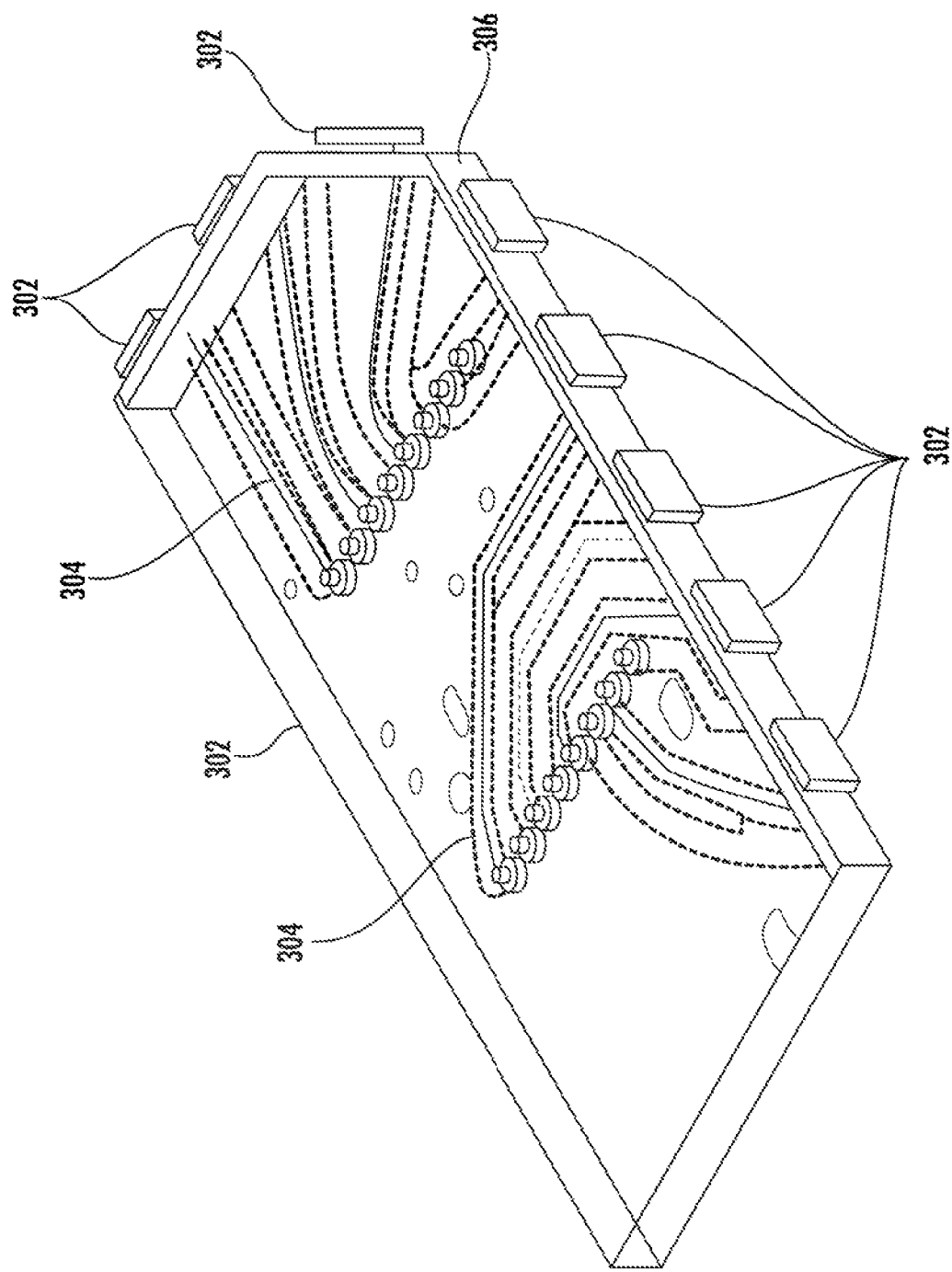
FIG. 3 illustrates an enlarged view of a portion of the user computing device of FIG. 2A.

FIG. 3 depicts a simplified schematic view of a plurality of antenna arrays 302 connected using respective feed lines 304 (e.g., with a front end module). The antenna arrays 302 can be mounted to a side surface 306 of the substrate 308, such as described and illustrated with respect to FIGS. 4A through 4C. The antenna arrays 302 can include a plurality of vertically connected elements (e.g., as a mesh-grid array). Thus, the antenna array 302 can generally extend parallel with the side surface 306 of the substrate 308. Shielding can optionally be provided on the side surface 306 of the substrate 308 such that the antenna arrays 302 are located outside of the shielding with respect to the substrate 308. The vertical spacing distance between the vertically connected elements of the antenna array 302 can correspond with the "feature sizes" of the antenna arrays 320. As such, in some embodiments, these spacing distances may be relatively small (e.g., less than about 750 micrometers) such that the antenna array 302 is a "fine pitch" antenna array 302.

Figure 4:
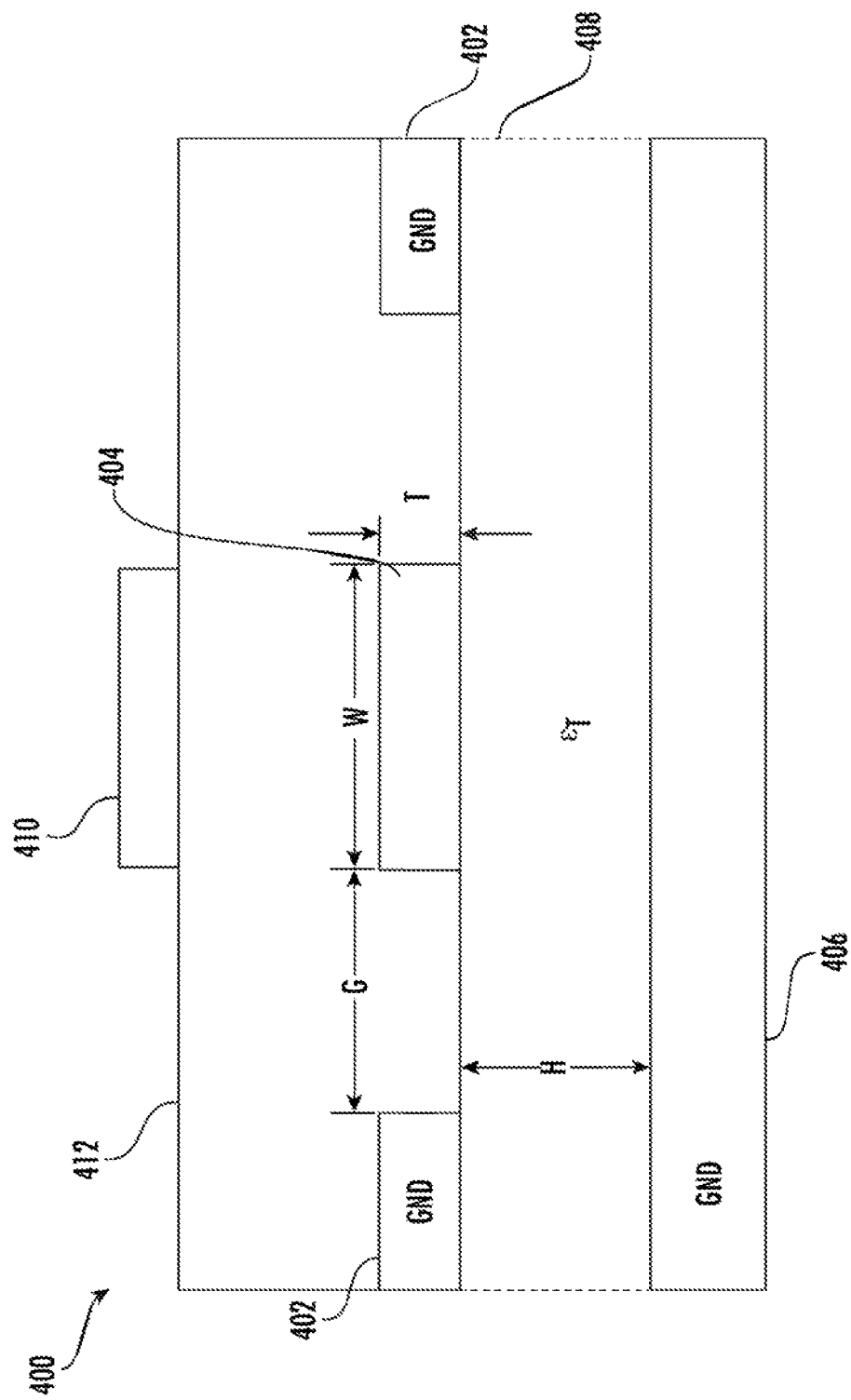
FIG. 4 illustrates a side elevation view of co-planar waveguide antenna array configuration that can be employed in a 5G antenna system.

FIG. 4 illustrates a side elevation view of a co-planar waveguide antenna 400 configuration. One or more co-planar ground layers 402 can be arranged parallel with an antenna element 404 (e.g., a patch antenna element). Another ground layer 406 may be spaced apart from the antenna element by a substrate 408. One or more additional antenna elements 410 can be spaced apart from the antenna element 404 by a second layer or substrate 412, which may be a circuit board as described herein. The dimensions "G" and "W" may correspond with "feature sizes" of the antenna 400. The "G" dimension may correspond with a distance between the antenna element 404 and the co-planar ground layer(s) 406. The "W" dimension can correspond with a width (e.g., linewidth) of the antenna element 404. As such, in some embodiments, dimensions "G" and "W" may be relatively small (e.g., less than about 750 micrometers) such that the antenna 400 is a "fine pitch" antenna 400.

Figure 5A:
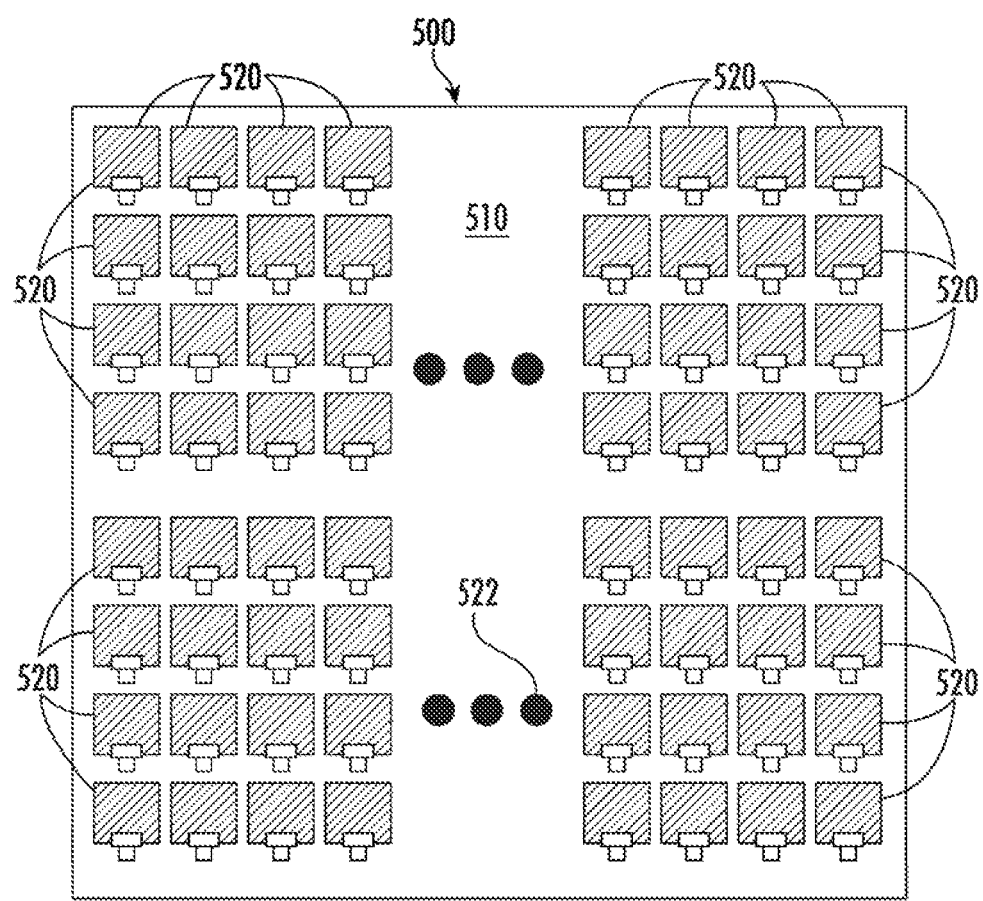
FIG. 5A illustrates an antenna array for massive multiple-in-multiple-out configurations of a 5G antenna system.

FIG. 5A illustrates one embodiment of an antenna array 500. The antenna array 500 can include a substrate 510 and a plurality of antenna elements 520 formed thereon. The plurality of antenna elements 520 can be approximately equally sized in the X- and/or Y-directions (e.g., square or rectangular). The plurality of antenna elements 520 can be spaced apart approximately equally in the X- and/or Y-directions. The dimensions of the antenna elements 520 and/or spacing therebetween can correspond with "feature sizes" of the antenna array 500. As such, in some embodiments, the dimensions and/or spacing may be relatively small (e.g., less than about 750 micrometers) such that the antenna array 500 is a "fine pitch" antenna array 500. As illustrated by the ellipses 522, the number of columns of antenna elements 520 illustrated in FIG. 5 is provided as an example only.

Similarly, the number of rows of antenna element 520 is provided as an example only.

The tuned antenna array 500 can be used to provide massive MIMO functionality, for example in a base station (e.g., as described above with respect to FIG. 1). More specifically, radio frequency interactions between the various elements can be controlled or tuned to provide multiple transmitting and/or receiving channels. Transmitting power and/or receiving sensitivity can be directionally controlled to focus or direct radio frequency signals, for example as described with respect to the radio frequency signals 112 of FIG. 1. The tuned antenna array 500 can provide a large number of antenna elements 522 in a small footprint. For example, the tuned antenna 500 can have an average antenna element concentration of 1,000 antenna elements per square cm or greater. Such compact arrangement of antenna elements can provide a greater number of channels for MIMO functionality per unit area. For example, the number of channels can correspond with (e.g., be equal to or proportional with) the number of antenna elements.

Figure 5C:
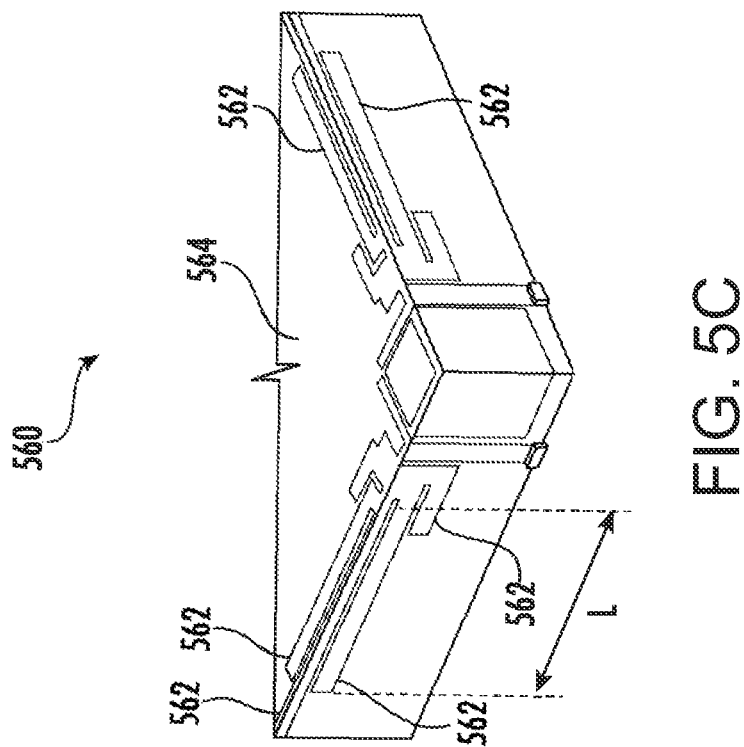
FIG. 5C illustrates an example antenna configuration that can be employed in a 5G antenna system.
Figure 5B:
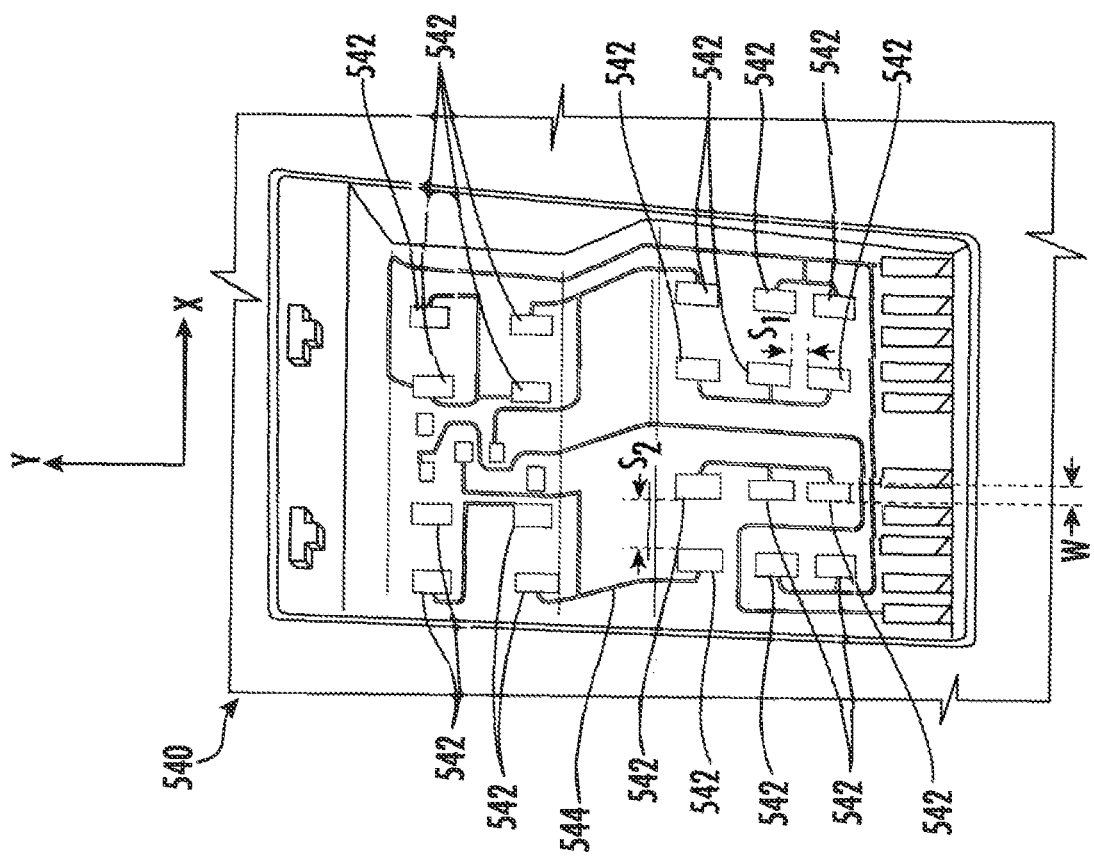
FIG. 5B illustrates an antenna array formed that can be employed in a 5G antenna system.

FIG. 5B illustrates an embodiment of an antenna array 540. The antenna array 540 can include a plurality of antenna elements 542 and plurality of feed lines 544 connecting the antenna elements 542 (e.g., with other antenna elements 542, a front end module, or other suitable component). The antenna elements 542 can have respective widths "w" and spacing distances "$S_1$" and "$S_2$" therebetween (e.g., in the X-direction and Y-direction, respectively). These dimensions can be selected to achieve 5G radio frequency communication at a desired 5G frequency. More specifically, the dimensions can be selected to tune the antenna array 540 for transmission and/or reception of data using radio frequency signals that are within the 5G frequency spectrum (e.g., greater the 2.5 GHz and/or greater than 3 GHz and/or greater than 28 GHz). The dimensions can be selected based on the material properties of the substrate. For example, one or more of "w", "$S_1$," or "$S_2$" can correspond with a multiple of a propagation wavelength ("λ") of the desired frequency through the substrate material (e.g., nλ/4 where n is an integer).

As one example, λ can be calculated as follows:

$$\lambda = \frac{c}{f\sqrt{\epsilon_R}}$$

where c is the speed of light in a vacuum, $\epsilon_R$ is the dielectric constant of the substrate (or surrounding material), f is the desired frequency.

FIG. 5C illustrates an example antenna configuration 560 according to aspects of the present invention. The antenna configuration 560 can include multiple antenna elements 562 arranged in parallel long edges of a substrate 564. The various antenna elements 562 can have respective lengths, "L" (and spacing distances therebetween) that tune the antenna configuration 560 for reception and/or transmission at a desired frequency and/or frequency range. More specifically, such dimensions can be selected based on a propagation wavelength, λ, at the desired frequency for the substrate material, for example as described above with reference to FIG. 5B.

The present invention may be better understood with reference to the following examples.

TEST METHODS

Melt Viscosity: The melt viscosity (Pa-s) may be determined in accordance with ISO Test No. 11443:2005 at a shear rate of 1,000 s$^{-1}$ and temperature 15° C. above the melting temperature (e.g., about 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2013. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection under load temperature may be determined in accordance with ISO Test No. 75-2:2013 (technically equivalent to ASTM D648-07). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2012 (technically equivalent to ASTM D638-14). Modulus and strength measurements may be made on the same test strip sample having a length of 80 mm, thickness of 10 mm, and width of 4 mm. The testing temperature may be about 23° C., and the testing speeds may be 1 or 5 mm/min.

Flexural Modulus, Flexural Stress, and Flexural Elongation: Flexural properties may be tested according to ISO Test No. 178:2010 (technically equivalent to ASTM D790-10). This test may be performed on a 64 mm support span. Tests may be run on the center portions of uncut ISO 3167 multi-purpose bars. The testing temperature may be about 23° C. and the testing speed may be 2 mm/min.

Unnotched and Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be about 23° C.

Dielectric Constant ("Dk") and Dissipation Factor ("Df"): The dielectric constant (or relative static permittivity) and dissipation factor are determined according to IEC 60250: 1969. Such techniques are also described in Baker-Jarvis, et al., *IEEE Trans. on Dielectric and Electrical Insulation*, 5(4), p. 571 (1998) and Krupka, et al., *Proc. 7$^{th}$ International Conference on Dielectric Materials: Measurements and Applications, IEEE Conference Publication No.* 430 (September 1996). More particularly, a plaque sample having a size of 80 mm×80 mm×1 mm was inserted between two fixed dielectric resonators. The resonator measures the permittivity component in the plane of the specimen. Five (5) samples may be tested and the average value is recorded.

EXAMPLE 1

Samples 1-3 are formed for use in an RF filter. LCP 1 is formed from 60% HBA, 4% HNA, 18% TA, and 18% BP. LCP 2 is formed from 48% HNA, 2% HBA, 25% BP, and 25% TA. Compounding was performed using an 18-mm single screw extruder. Parts are injection molded the samples into plaques (60 mm×60 mm). The formulations are set forth below.

|  | Sample 1 | Sample 2 | Sample 3 |
|---|---|---|---|
| LCP 1 | 57.4 | | |
| Copper Chromite | 6.6 | | |
| Talc | 16 | | |
| Glass Fibers | 20 | 40 | |
| Glycolube P | | 0.3 | |
| 3-Aminopropyltriethoxysilane | | 0.42 | |
| Fortron ® PPS 0203 | | 58.78 | |
| Fortron ® PPS 1100 | | 2.5 | |
| LCP 2 | | | 67 |
| Mica | | | 22 |
| Glass Powder | | | 10 |
| Pigment | | | 1 |

Samples 1-3 were tested for thermal and mechanical properties. The results are set forth below.

|  | Sample 1 | Sample 2 | Sample 3 |
|---|---|---|---|
| Dk @ 2 GHz | 4.2 | 4.2 | 3.9 |
| Df @ 2 GHz | 0.0052 | 0.0044 | 0.0015 |
| Dk @ 10 GHz | 4.1 | 4.0 | 4.0 |
| Df @ 10 GHz | 0.0049 | 0.0060 | 0.0014 |
| Tensile strength (MPa) | 130 | 195 | 135 |
| Tensile modulus (MPa) | 14,000 | 14,700 | 12,300 |
| Tensile elongation (%) | 1.9 | 1.7 | 1.8 |
| Flexural strength (MPa) | 180 | 285 | 180 |
| Flexural modulus (MPa) | 14,000 | 14,500 | 12,000 |

EXAMPLE 2

Samples 4-10 are formed from various combinations of liquid crystalline polymers (LCP 1 and LCP 3), copper chromite filler (CuCr$_2$O$_4$), glass fibers, alumina trihydrate ("ATH"), lubricant (polyethylene wax), and polytetrafluoroethylene ("PTFE 1" or "PTFE 2"). LCP 3 is formed from 43% HBA, 9% TA, 29% HQ, and 20% NDA. PTFE 1 is a powder of polytetrafluoroethylene particles having a D50 particle size of 4 μm and a D90 particle size of 15 μm. PTFE 2 is a powder of polytetrafluoroethylene particles having a D50 particle size of 40 μm. Compounding was performed using an 18-mm single screw extruder. Parts are injection molded the samples into plaques (60 mm×60 mm).

|  | 4 | 5 | 6 | 7 | 8 | 9 | 10 |
|---|---|---|---|---|---|---|---|
| LCP 3 | 77.6 | 78 | 80 | 73 | 68 | 73 | 68 |
| LCP 1 | 17.6 | — | — | — | — | — | — |
| Glass Fibers | 15 | 15 | 13 | 15 | 15 | 15 | 15 |
| Alumina Trihydrate | 0.2 | 0.2 | 0.2 | 0.2 | 0.2 | 0.2 | 0.2 |
| Lubricant | 0.2 | 0.2 | 0.2 | 0.2 | 0.2 | 0.2 | 0.2 |
| Copper Chromite | 4.4 | 6.6 | 6.6 | 6.6 | 6.6 | 6.6 | 6.6 |
| PTFE 1 | — | — | — | 5 | 10 | — | — |
| PTFE 2 | — | — | — | — | — | 5 | 10 |

Samples 4-10 were tested for thermal and mechanical properties. The results are set forth below in the table below.

| Sample | 4 | 5 | 6 | 7 | 8 | 9 | 10 |
|---|---|---|---|---|---|---|---|
| Dielectric Constant (2 GHz) | 3.73 | 3.69 | 3.64 | 3.66 | 3.6 | 3.7 | 3.6 |
| Dissipation Factor (2 GHz) | 0.0056 | 0.0036 | 0.0035 | 0.0042 | 0.0038 | 0.0036 | 0.004 |
| Dielectric Constant (10 GHz) | — | — | — | 3.74 | — | — | — |
| Dissipation Factor (10 GHz) | — | — | — | 0.0037 | — | — | — |
| DTUL at 1.8 MPa (° C.) | 239 | 282 | 278 | 258 | 277 | 277 | 270 |
| Charpy Notched (kJ/m$^2$) | 51 | 45 | 52 | 68 | 53 | 44 | 19 |
| Charpy Unnotched (kJ/m$^2$) | 58 | 57 | 60 | 80 | 77 | 55 | 36 |
| Tensile Strength (MPa) | 134 | 142 | 140 | 129 | 113 | 164 | 126 |
| Tensile Modulus (MPa) | 10,547 | 12,090 | 11,880 | 8,971 | 10,026 | 12,666 | 12,359 |
| Tensile Elongation (%) | 3.08 | 2.56 | 2.58 | 3.74 | 2.98 | 2.82 | 1.7 |
| Flexural Strength (MPa) | 158 | 189 | 189 | 140 | 143 | 191 | 174 |
| Flexural Modulus (MPa) | 9,834 | 10,601 | 10,510 | 8,725 | 9,921 | 11,314 | 11,061 |
| Flexural Elongation (%) | >23.5 | >3.5 | >3.5 | >3.5 | >3.5 | 3.24 | 3.33 |
| Melt Viscosity (Pa-s) at 1,000 s$^{-1}$ | 24 | 36 | 37 | 30 | 44 | 44 | 62 |
| Melting Temperature (° C., 1$^{st}$ heat of DSC) | 309.98 | 320.26 | 320.58 | 324.25 | 324.65 | 320.76 | 322.95 |

EXAMPLE 3

Sample 11 contains 100 wt. % LCP 4 for use in an RF filter, which is is formed from 62% HNA, 2% HBA, 18% TA, and 18% BP. Samples are injection molded into plaques (60 mm×60 mm) and tested for thermal and mechanical properties. The results are set forth below.

|  | Sample 11 |
|---|---|
| Dk @ 10 GHz | 3.36 |
| Df @ 10 GHz | 0.0007 |
| Tensile strength (MPa) | 165 |
| Tensile modulus (MPa) | 15,382 |
| Tensile elongation (%) | 1.2 |
| Flexural strength (MPa) | 215 |
| Flexural modulus (MPa) | 15,792 |
| Charpy Notched (KJ/m$^2$) | 17.3 |
| DTUL at 1.8 MPa (° C.) | 313.5 |
| Melting Temperature (° C.) (1$^{st}$ heat of DSC) | 334 |

EXAMPLE 4

Samples 17-24 are formed from various combinations of a liquid crystalline polymer (LCP 2), milled and/or flat chopped glass fiber strands (aspect ratio=4), mica (MICA 1 and MICA 2), and silica. MICA 1 had an average particle size of 25 micrometers and MICA had an average particle size of 60 micrometers. Compounding was performed using an 18-mm single screw extruder. Parts are injection molded the samples into plaques (60 mm×60 mm).

|  | 17 | 18 | 19 | 20 | 21 | 22 | 23 | 24 |
|---|---|---|---|---|---|---|---|---|
| LCP 2 | 78 | 68 | 78 | 78 | 68 | 78 | 68 | 80 |
| Milled Glass Fibers | — | 10 | — | — | 10 | — | — | — |
| Flat Glass Fibers | — | — | 10 | 15 | — | 10 | 10 | — |
| MICA 1 | 22 | 22 | 12 | 17 | — | — | — | 20 |
| MICA 2 | — | — | — | — | 22 | 12 | — | — |
| Silica | — | — | — | — | — | — | 12 | — |

Samples 12-19 were tested for thermal and mechanical properties. The results are set forth in the table below.

| Sample | 12 | 13 | 14 | 15 | 16 | 17 | 18 | 19 |
|---|---|---|---|---|---|---|---|---|
| Dielectric Constant (2 GHz) | 3.96 | 3.95 | 3.96 | 4.03 | 4.04 | 4.07 | 3.67 | 3.7 |
| Dissipation Factor (2 GHz) | 0.0014 | 0.0015 | 0.0015 | 0.0021 | 0.0021 | 0.0019 | 0.0016 | 0.0009 |
| Dielectric Constant (10 GHz) | — | 4.03 | — | — | — | — | — | 3.78 |
| Dissipation Factor (10 GHz) | — | 0.0015 | — | — | — | — | — | 0.0078 |
| DTUL at 1.8 MPa (° C.) | — | — | — | — | — | — | — | 298 |
| Charpy Notched (kJ/m$^2$) | — | — | — | — | — | — | — | 8.6 |
| Charpy Unnotched (kJ/m$^2$) | — | — | — | — | — | — | — | — |
| Tensile Strength (MPa) | 142 | 146 | 124 | 134 | 128 | 134 | 121 | 179 |
| Tensile Modulus (MPa) | 13,731 | 14,422 | 13,385 | 13,851 | 13,578 | 14,691 | 10,186 | 12,795 |
| Tensile Elongation (%) | 1.96 | 1.64 | 1.39 | 1.74 | 1.57 | 1.37 | 2.1 | 2.3 |
| Flexural Strength (MPa) | 195 | 222 | 204 | 206 | 204 | 211 | 182 | 205 |
| Flexural Modulus (MPa) | 13,349 | 14,074 | 13,307 | 13,492 | 13,331 | 14,361 | 10,283 | 12,888 |
| Flexural Elongation (%) | 2.55 | 2.26 | 2.17 | 2.3 | 2.3 | 1.97 | 2.77 | 2.9 |
| Melt Viscosity (Pa-s) at 1,000 s$^{-1}$ | 38 | 48 | 44 | 39 | 36 | 52 | 56 | 25.8 |
| Melting Temperature (° C.) (1$^{st}$ heat of DSC) | 343 | 345 | 344 | 344 | 343 | 343 | 346 | 340 |

EXAMPLE 5

Sample 20 contains 100 wt. % LCP 5 for use in an RF filter, which is is formed from 73% HNA and 27% HBA. Samples are injection molded into plaques (60 mm×60 mm) and tested for thermal and mechanical properties. The results are set forth below.

|  | Sample 20 |
| --- | --- |
| Dk @ 10 GHz | 3.41 |
| Df @ 10 GHz | 0.00098 |
| Tensile strength (MPa) | 140 |
| Tensile modulus (MPa) | 6,883 |
| Tensile elongation (%) | 5.8 |
| Flexural strength (MPa) | 173 |
| Flexural modulus (MPa) | 8,873 |
| Charpy Notched (KJ/m$^2$) | 78.8 |
| DTUL at 1.8 MPa (° C.) | 199.6 |
| Melting Temperature (° C.) (1$^{st}$ heat of DSC) | 316 |

EXAMPLE 6

Sample 21 contains 100 wt. % LCP 6 for use in an RF filter, which is is formed from 78% HNA, 2% HBA, 10% TA, and 10% BP. Samples are injection molded into plaques (60 mm×60 mm) and tested for thermal and mechanical properties. The results are set forth below.

|  | Sample 21 |
| --- | --- |
| Dk @ 10 GHz | 3.45 |
| Df @ 10 GHz | 0.00068 |
| Tensile strength (MPa) | 100 |
| Tensile modulus (MPa) | 11,638 |
| Tensile elongation (%) | 0.89 |
| Flexural strength (MPa) | 167 |
| Flexural modulus (MPa) | 12,258 |
| Charpy Notched (KJ/m$^2$) | 1.9 |
| DTUL at 1.8 MPa (° C.) | 306.6 |
| Melting Temperature (° C.) (1$^{st}$ heat of DSC) | 338 |

EXAMPLE 7

Sample 22 contains 100 wt. % LCP 7 for use in an RF filter, which is is formed from 79% HNA, 2% HBA, 14% TA, and 14% BP. Samples are injection molded into plaques (60 mm×60 mm) and tested for thermal and mechanical properties. The results are set forth below.

|  | Sample 22 |
| --- | --- |
| Dk @ 10 GHz | 3.40 |
| Df @ 10 GHz | 0.00066 |
| Tensile strength (MPa) | 131 |
| Tensile modulus (MPa) | 18,173 |
| Tensile elongation (%) | 0.75 |
| Flexural strength (MPa) | 225 |
| Flexural modulus (MPa) | 17,275 |
| Charpy Notched (KJ/m$^2$) | 7.2 |
| DTUL at 1.8 MPa (° C.) | 313.5 |
| Melting Temperature (° C.) (1$^{st}$ heat of DSC) | 331 |

EXAMPLE 8

Sample 23 contains 100 wt. % LCP 8 for use in an RF filter, which is is formed from 48% HNA, 2% HBA, 25% NDA, and 25% BP. Samples are injection molded into plaques (60 mm×60 mm) and tested for thermal and mechanical properties. The results are set forth below.

|  | Sample 23 |
| --- | --- |
| Dk @ 10 GHz | 3.48 |
| Df @ 10 GHz | 0.00064 |
| Tensile strength (MPa) | 160 |
| Tensile modulus (MPa) | 7,332 |
| Tensile elongation (%) | 2.71 |
| Flexural strength (MPa) | 159 |
| Flexural modulus (MPa) | 7,678 |
| Charpy Notched (KJ/m$^2$) | 43.5 |
| DTUL at 1.8 MPa (° C.) | 234 |
| Melting Temperature (° C.) (1$^{st}$ heat of DSC) | 329 |

EXAMPLE 9

Sample 24 contains 100 wt. % LCP 9 for use in an RF filter, which is is formed from 76% HNA and 24% HBA. Samples are injection molded into plaques (60 mm×60 mm) and tested for thermal and mechanical properties. The results are set forth below.

|  | Sample 24 |
| --- | --- |
| Dk @ 10 GHz | 3.41 |
| Df @ 10 GHz | 0.0010 |
| Tensile strength (MPa) | 160 |
| Tensile modulus (MPa) | 8,720 |
| Tensile elongation (%) | 2.12 |
| Flexural strength (MPa) | 175 |
| Flexural modulus (MPa) | 8,926 |
| Charpy Notched (KJ/m$^2$) | 52.6 |
| DTUL at 1.8 MPa (° C.) | 208.1 |
| Melting Temperature (° C.) (1$^{st}$ heat of DSC) | 325 |

EXAMPLE 10

Samples 25-26 are formed from various combinations of liquid crystalline polymers (LCP 9 and LCP 4) and PTFE 1. Compounding was performed using an 18-mm single screw extruder. Parts are injection molded the samples into plaques (60 mm×60 mm).

|  | 25 | 26 |
| --- | --- | --- |
| LCP 9 | 75 | — |
| LCP 4 | — | 75 |
| PTFE 1 | 25 | 25 |

Samples 38-39 were tested for thermal and mechanical properties. The results are set forth below in the table below.

| Sample | 25 | 26 |
| --- | --- | --- |
| Dielectric Constant (2 GHz) | 3.18 | 3.17 |
| Dissipation Factor (2 GHz) | 0.0010 | 0.0006 |
| DTUL at 1.8 MPa (° C.) | 201 | 306 |
| Charpy Notched (kJ/m$^2$) | 54 | 10 |
| Tensile Strength (MPa) | 127 | — |
| Tensile Modulus (MPa) | 5,900 | — |
| Tensile Elongation (%) | 3.5 | — |
| Flexural Strength (MPa) | 135 | 137 |
| Flexural Modulus (MPa) | 7,000 | 14,000 |

EXAMPLE 11

Samples 27-28 may be used in an RF filter. Sample 27 contains 70 wt. % LCP 3 and 30 wt. % PTFE 1 and Sample 28 contains 65 wt. % LCP 3 and 35% wt. % PTFE 1. Samples 27-28 were tested for thermal and mechanical properties. The results are set forth below.

|  | Sample 27 | Sample 28 |
|---|---|---|
| Dk @ 10 GHz | 3.03 | 2.97 |
| Df @ 10 GHz | 0.0013 | 0.0013 |
| Melt Viscosity (1,000 s$^{-1}$ at 340° C.) | 39.0 | 39.5 |
| Tensile strength (MPa) | 141 | 106 |
| Tensile modulus (MPa) | 7,028 | 6,339 |
| Tensile elongation (%) | 3.15 | 2.43 |
| Flexural strength (MPa) | 125 | 112 |
| Flexural modulus (MPa) | 7,435 | 6,832 |
| DTUL at 1.8 MPa | 248.4 | 246.8 |
| Charpy Notched Strength (kJ/m$^2$) | 59.2 | 51.7 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An RF filter comprising a resonator element and a polymer composition, wherein the polymer composition contains an aromatic polymer and has a melting temperature of about 240° C. or more, the polymer composition exhibiting a dielectric constant of about 5 or less and dissipation factor of about 0.05 or less at a frequency of 10 GHz, wherein aromatic polymer is a wholly aromatic liquid crystalline polymer containing repeating units derived from naphthenic hydroxycarboxylic acids and/or naphthenic dicarboxylic acids in an amount of about 10 mol. % or more.

2. The RF filter of claim 1, wherein the filter is an acoustic filter that includes a piezoelectric material.

3. The RF filter of claim 2, wherein transducers are formed on the piezoelectric material.

4. The RF filter of claim 2, wherein the piezoelectric material is positioned between upper and lower metal layers.

5. The RF filter of claim 2, wherein the acoustic filter contains a substrate that supports the piezoelectric material.

6. The RF filter of claim 5, wherein the substrate contains the polymer composition.

7. The RF filter of claim 2, further comprising a housing that overlies the resonator element.

8. The RF filter of claim 7, wherein the housing contains the polymer composition.

9. The RF filter of claim 1, wherein the filter is a cavity filter that includes a housing that defines a cavity within which the resonator element is received.

10. The RF filter of claim 9, wherein the resonator element is a dielectric material.

11. The RF filter of claim 9, wherein the housing contains the polymer composition.

12. The RF filter of claim 9, further comprising a cover that overlies the housing, the cover comprising the polymer composition.

13. The RF filter of claim 1, wherein the aromatic polymer has a glass transition temperature of about 30° C. or more and a melting temperature of about 240° ° C. or more.

14. The RF filter of any claim 1, wherein aromatic polymers constitute from about 40 wt. % to about 99 wt % of the polymer composition.

15. The RF filter of claim 1, wherein the liquid crystalline polymer contains repeating units derived from one or more aromatic dicarboxylic acids, one or more aromatic hydroxycarboxylic acids, or a combination thereof.

16. The RF filter of claim 15, wherein the aromatic hydroxycarboxylic acids include 4-hydroxybenzoic acid, 6-hydroxy-2-naphthoic acid, or a combination thereof.

17. The RF filter of claim 15, wherein the aromatic hydroxycarboxylic acids include terephthalic acid, isophthalic acid, 2,6-naphthalenedicarboxylic acid, or a combination thereof.

18. The RF filter of claim 15, wherein the liquid crystalline polymer further contains repeating units derived from one or more aromatic diols.

19. The RF filter of claim 18, wherein the aromatic diols include hydroquinone, 4,4'-biphenol, or a combination thereof.

20. The RF filter of claim 1, wherein the liquid crystalline polymer contains repeating units derived from 6-hydroxy-2-naphthoic acid in an amount of about 30 mol. % or more.

21. The RF filter of claim 1, wherein the liquid crystalline polymer contains repeating units derived from 6-hydroxy-2-naphthoic acid in an amount of about 50 mol. % or more.

22. The RF filter of claim 1, wherein the polymer composition further comprises a fibrous filler.

23. The RF filter of claim 22, wherein the fibrous filler includes glass fibers.

24. The RF filter of claim 22, wherein the fibrous filler has an aspect ratio of about 2 or more.

25. The RF filter of claim 1, wherein the polymer composition further comprises a particulate filler.

26. The RF filter of claim 25, wherein the particulate filler includes mica.

27. The RF filter of claim 1, wherein the polymer composition further comprises a laser activatable additive.

28. The RF filter of claim 1, wherein the polymer composition exhibits a dielectric constant of from about 1.5 to about 4 at a frequency of 2 GHz.

29. The RF filter of claim 1, wherein the polymer composition exhibits a dissipation factor of about 0.0009 or less at a frequency of 2 GHz.

30. A 5G antenna system comprising the RF filter of claim 1 and at least one antenna element configured to transmit and receive 5G radio frequency signals.

31. The 5G antenna system of claim 30, wherein the antenna element has a feature size that is less than about 1,500 micrometers.

32. The 5G antenna system of claim 30, wherein the 5G radio frequency signals have a frequency that is greater than about 28 GHz.

33. The 5G antenna system of claim 30, further comprising a base station, and wherein the base station comprises the antenna element.

34. The 5G antenna system of claim 33, further comprising at least one of a user computing device or a repeater, and wherein the at least one of the user computing device or the repeater base station comprises the antenna element.

35. A 5G antenna system comprising an RF filter and a plurality of antenna elements configured to transmit and receive 5G radio frequency signals, wherein the antenna elements are arranged in an antenna array, and wherein the RF filter comprises a resonator element and a polymer composition, wherein the polymer composition contains an aromatic polymer and has a melting temperature of about 240° ° C. or more, the polymer composition exhibiting a dielectric constant of about 5 or less and dissipation factor of about 0.05 or less at a frequency of 10 GHz.

36. The 5G antenna system of claim 35, wherein the plurality of antenna elements are spaced apart by a spacing distance that is less than about 1,500 micrometers.

37. The 5G antenna system of claim 35, wherein the plurality of antenna elements comprise at least 16 antenna elements.

38. The 5G antenna system of claim 35, wherein the plurality of antenna elements are arranged in a grid.

39. The 5G antenna system of claim 35, wherein the antenna array is configured for at least 8 transmission channels and at least 8 reception channels.

40. The 5G antenna system of claim 35, wherein the antenna array has an average antenna element concentration of greater than 1,000 antenna elements per square centimeter.

41. An RF filter comprising a resonator element and a polymer composition, wherein the polymer composition contains an aromatic polymer and has a melting temperature of about 240° C. or more, the polymer composition exhibiting a dielectric constant of about 5 or less and dissipation factor of about 0.05 or less at a frequency of 10 GHz, wherein the polymer composition comprises a fibrous filler having an aspect ratio of about 2 or more.

42. The RF filter of claim 41, wherein the aromatic polymer comprises a liquid crystalline polymer.

43. The RF filter of claim 41, wherein the aromatic polymer comprises a polyarylene sulfide.

\* \* \* \* \*